United States Patent
Nave et al.

(10) Patent No.: US 10,888,026 B2
(45) Date of Patent: Jan. 5, 2021

(54) AIR CURTAIN CANISTER FOR ENVIRONMENTAL CONTROL IN AUTOMATED DATA STORAGE LIBRARIES

(71) Applicant: International Business Machines Corporation, Armonk, NY (US)

(72) Inventors: Shawn M. Nave, Tucson, AZ (US); Michael P. McIntosh, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 16/191,297

(22) Filed: Nov. 14, 2018

(65) Prior Publication Data
US 2020/0154609 A1   May 14, 2020

(51) Int. Cl.
  *H05K 7/20* (2006.01)
  *G05B 19/042* (2006.01)
  *F24F 9/00* (2006.01)

(52) U.S. Cl.
  CPC ........... *H05K 7/20736* (2013.01); *F24F 9/00* (2013.01); *G05B 19/0423* (2013.01); *H05K 7/20145* (2013.01); *H05K 7/20172* (2013.01); *H05K 7/20836* (2013.01); *G05B 2219/25166* (2013.01); *G05B 2219/2614* (2013.01)

(58) Field of Classification Search
  CPC ........... H05K 7/20736; H05K 7/20145; H05K 7/20172; H05K 7/20836; F24F 9/00; G05B 19/0423; G05B 2219/25166; G05B 2219/2614
  USPC ....................................................... 360/92.1
  See application file for complete search history.

(56) References Cited

U.S. PATENT DOCUMENTS

| 5,301,178 | A  | 4/1994  | Okabe et al.    |
| 6,906,918 | B2 | 6/2005  | Rabinovitz      |
| 7,400,510 | B1 | 7/2008  | Milligan et al. |
| 8,376,822 | B1 | 2/2013  | Smith et al.    |
| 9,852,758 | B1 | 12/2017 | McIntosh et al. |
| 10,839,859 | B2 | 11/2020 | Nave et al.    |

(Continued)

FOREIGN PATENT DOCUMENTS

CA   2967088 A1   7/2017

OTHER PUBLICATIONS

Nave et al., U.S. Appl. No. 16/191,281, filed Nov. 14, 2018.

(Continued)

*Primary Examiner* — Allen T Cao
(74) *Attorney, Agent, or Firm* — Zilka-Kotab, P.C.

(57) ABSTRACT

An air curtain canister for creating an air curtain includes a housing having a form factor approximating an exterior of a data storage drive. The air curtain canister also includes a fan for creating an airflow in the housing and a nozzle for directing the airflow exiting the housing in a predefined trajectory for creating an air curtain. A data storage library includes an array of drive slots each configured to receive a data storage drive therein. The data storage library also includes a plurality of air curtain canisters positioned laterally in the array of drive slots for creating an air curtain across a front of the remaining drive slots in the array. A method includes selectively instructing air curtain canisters in a data storage library to create an air curtain across a front of an array of drive slots in the data storage library.

24 Claims, 19 Drawing Sheets

(56) References Cited

U.S. PATENT DOCUMENTS

| | | |
|---|---|---|
| 2007/0209653 A1 | 9/2007 | Beisheim et al. |
| 2008/0007912 A1 | 1/2008 | Matsushima et al. |
| 2009/0002549 A1 | 1/2009 | Kobayashi |
| 2010/0129183 A1 | 5/2010 | Tanaka |
| 2011/0029154 A1* | 2/2011 | Shah .................. G06F 1/20 700/300 |
| 2012/0087077 A1* | 4/2012 | Wei .................. H05K 7/20745 361/679.31 |
| 2017/0181306 A1 | 6/2017 | Shaw et al. |
| 2018/0066859 A1 | 3/2018 | Nguyen |
| 2020/0152241 A1 | 5/2020 | Nave et al. |

OTHER PUBLICATIONS

List of IBM Patents or Patent Applications Treated as Related.

Liangzhu (Leon) Wang, "Investigation of the Impact of Building Entrance Air Curtain on Whole Building Energy Use," AMCA International, Jun. 20, 2018, pp. 1-16.

Non-Final Office Action from U.S. Appl. No. 16/191,281, dated Aug. 29, 2019.

Final Office Action from U.S. Appl. No. 16/191,281, dated Dec. 11, 2019.

Notice of Allowance from U.S. Appl. No. 16/191,281, dated May 29, 2020.

Notice of Allowance from U.S. Appl. No. 16/191,281, dated Jul. 15, 2020.

Supplemental Notice of Allowance from U.S. Appl. No. 16/191,281, dated Oct. 19, 2020.

* cited by examiner

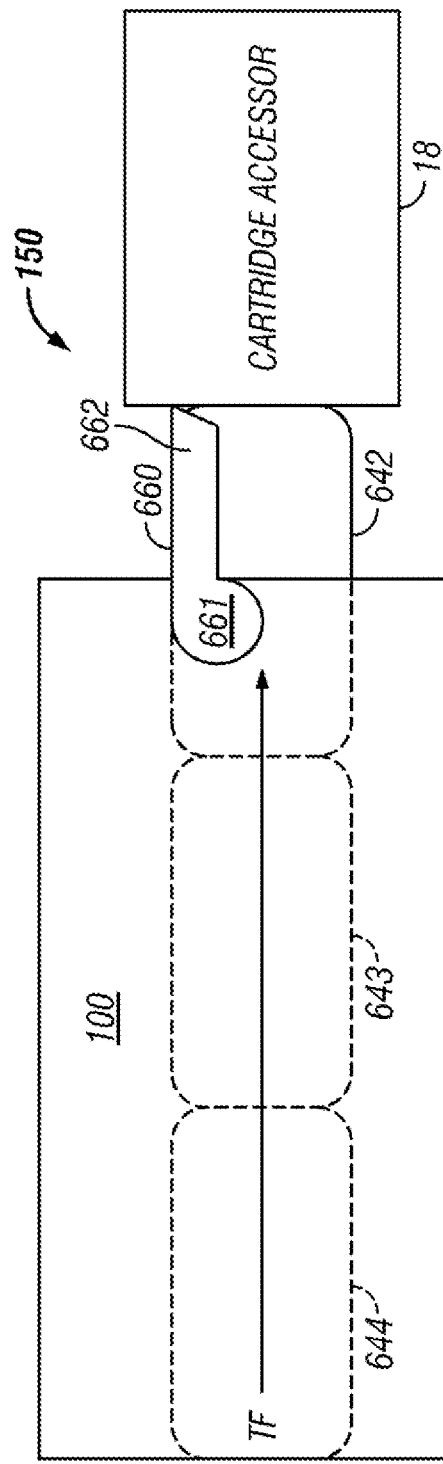
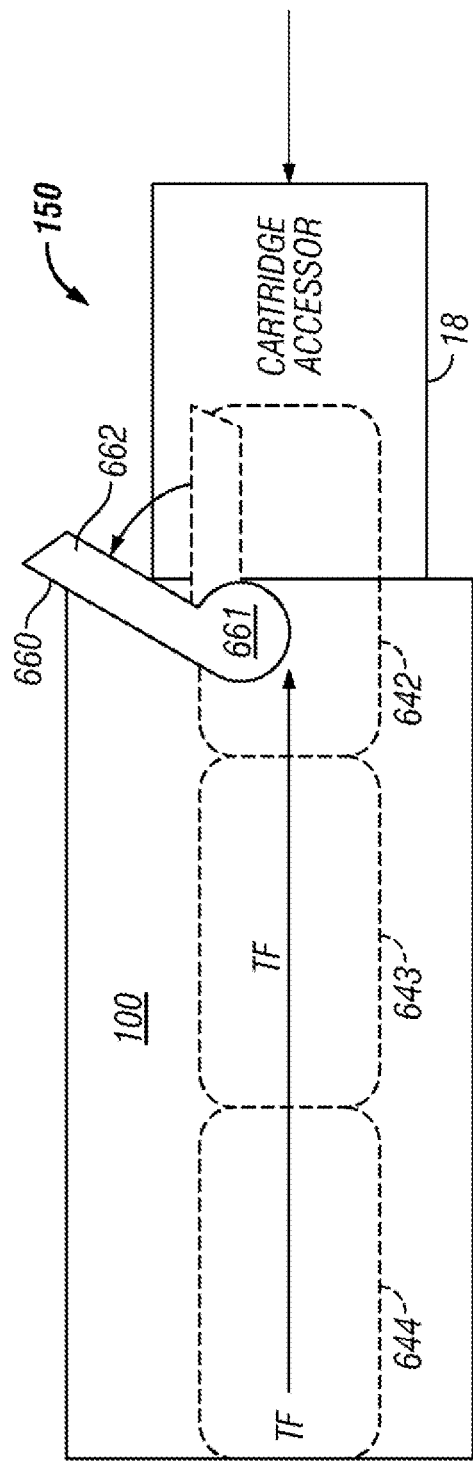
FIG. 8A
FIG. 8B

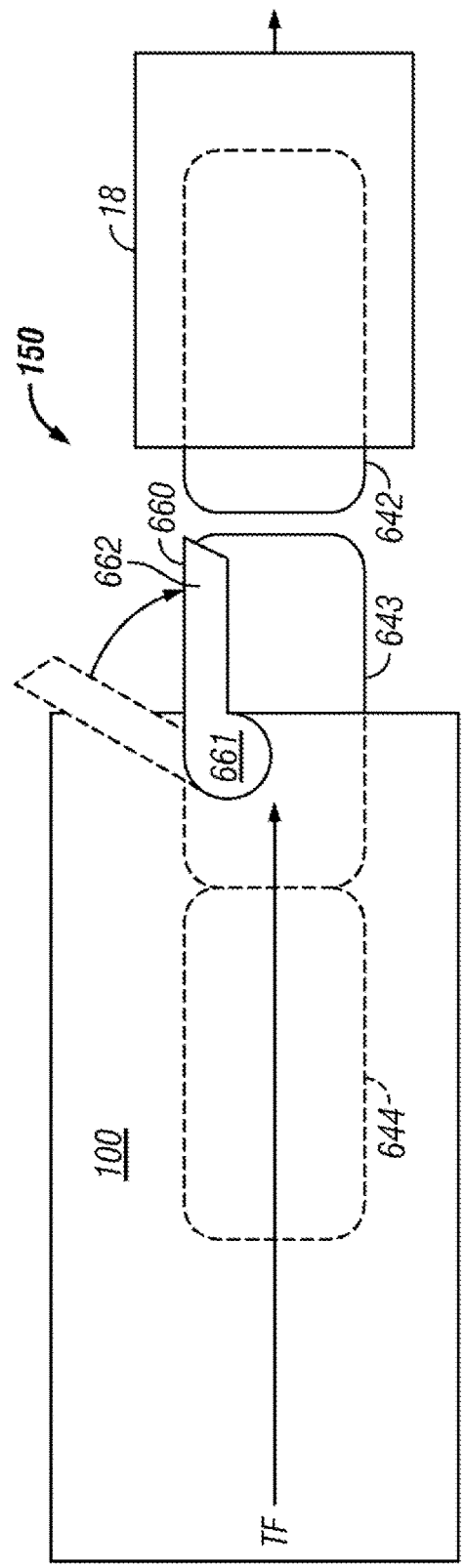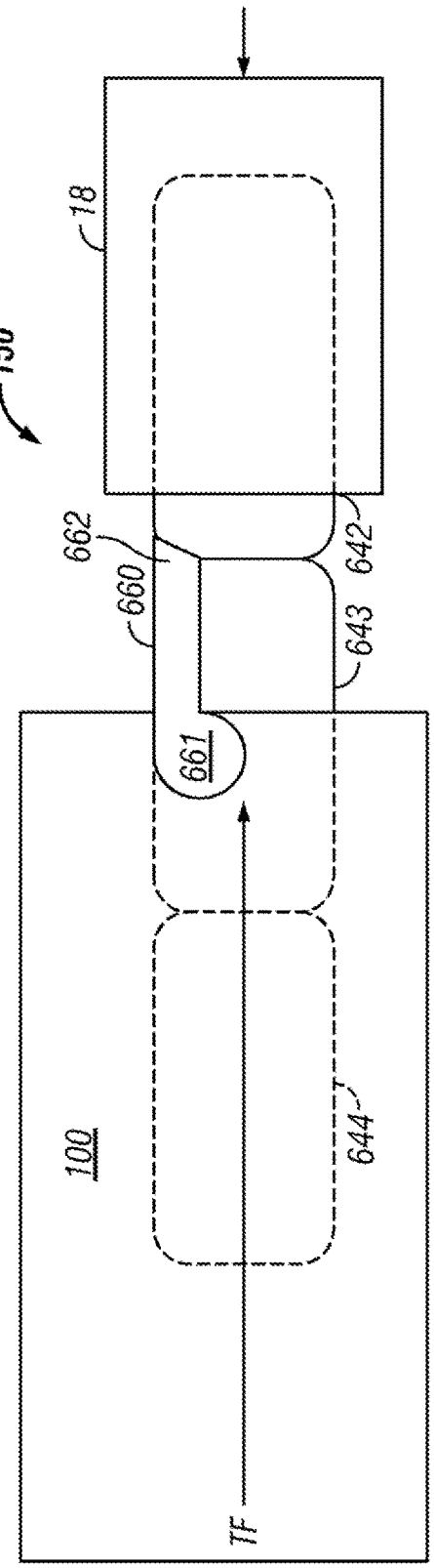
FIG. 8C
FIG. 8D

AIR CURTAIN CANISTER FOR ENVIRONMENTAL CONTROL IN AUTOMATED DATA STORAGE LIBRARIES

BACKGROUND

The present invention relates to data storage systems, and more particularly, this invention relates to an air curtain system for environmental control in automated data storage libraries.

Automated data storage libraries are known for providing cost effective storage and retrieval of large quantities of data. The data in automated data storage libraries is typically stored on media of data storage cartridges that are, in turn, stored at storage slots or the like inside the library in a fashion that renders the media, and its resident data, accessible for physical retrieval. Such data storage cartridges are commonly termed "removable media." Data storage cartridge media may comprise any type of media on which data may be stored and which may serve as removable media, including but not limited to magnetic media (such as magnetic tape or disks), optical media (such as optical tape or discs), electronic media (such as PROM, EEPROM, flash PROM, CompactFlash™, Smartmedia™, Memory Stick™, etc.), or other suitable media. An example of a data storage cartridge that is widely employed in automated data storage libraries for mass data storage is a magnetic tape cartridge.

In addition to data storage media, automated data storage libraries typically comprise data storage drives that store data to, and/or retrieve data from, the data storage cartridge media. Further, automated data storage libraries typically comprise I/O stations at which data storage cartridges are supplied or added to, or removed from, the library. The transport of data storage cartridges between data storage slots, data storage drives, and I/O stations is typically accomplished by one or more accessors. Such accessors have grippers for physically retrieving the selected data storage cartridges from the storage slots within the automated data storage library and transporting such cartridges to the data storage drives by moving, for example, in the horizontal (X) and vertical (Y) directions.

In an effort to increase storage capacity, deep slot technology allows for storage cells that contain more than a single data storage cartridge. Such storage libraries allow for higher density, or more cartridges stored per square foot. In 'deep slot' libraries, two or more cartridges may be stored in a multi-cartridge deep slot cell, arrayed in series, one behind the other, in tiers ranging from a frontmost tier to a rearmost tier.

Data centers with free-cooling facility environments have wider ranges of temperature and relative humidity than traditional data centers with dedicated computer room air conditioners (CRACs). While servers and disk-based storage equipment may be able to operate within these wider ranges, tape storage equipment cannot operate reliably in the extreme limits of these conditions. Self-cooling libraries include automated tape libraries that are appropriately sealed and fitted with integral air conditioning. Self-cooling libraries control the temperature and the relative humidity of the environment in the library so that the contained tape drives and tape media operating conditions are acceptable.

Problems occur when a data storage library door is opened for operator and/or service access. When a library door is opened, unsafe, outside air may enter the enclosure. Data storage media and/or data storage equipment may be damaged if the ambient temperature and/or the relative humidity of the air entering the enclosure is outside the safe and/or functional operating limits of the data storage media and/or data storage equipment.

In a self-cooling library, when the ambient temperature and/or relative humidity of the data center becomes warm and moist (e.g. at a temperature of 35 degrees Celsius and 80% relative humidity), the tape drives inside the library may have an internal temperature of approximately 25 degrees Celsius. This internal temperature is below the dew point temperature of the outside air. If the internal temperature is below the dew point temperature of the outside air, in response to opening the front door of the library, the outside air may enter the tape drive and water vapor may condense on the tape drive read/write head element and/or other sensitive elements. Condensation may result in permanent damage, e.g., corrosion, to the tape drive read/write head element and/or other sensitive elements.

The tape drives in a self-cooling library are housed in tape drive canister assemblies that include cooling fans that draw air from the front of the tape drive canister and exhaust air out of the back of the tape drive canister. The front of the tape drive canister typically faces the door of the library enclosure so that the tape drive canister cooling fans actively pull the warm and moist air through the tape drive. This active pulling of warm and moist air through the tape drive increases the probability that condensation occurs in the tape drive.

Another problem that may arise in a self-cooling library involves inadequate internal air mixing. Inadequate internal air mixing may create warm and cold regions in the library. The warm and cold regions in the library may result in tape drives maintained at varying operating temperatures. Different operating temperatures in the library may result in undesirable variations in the long-term reliability of the tape drives and may reduce the probability that all tapes may be read on all drives.

A prior attempt to address condensation and air mixing issues includes implementing an indicator on the front of the library that lights up when the tape drive internal temperature and relative humidity are such that condensation is possible. The indicator light warns that the door should not be opened at that time.

A drawback to this attempted approach is that the inside of the library cannot be accessed when the indicator light is on and, therefore, any operator and/or service action is delayed until the environmental conditions in the library change sufficiently to turn off the indicator light. This delay may be hours or days.

Further attempts to address condensation and/or air mixing issues include putting tape drive canisters into a "self-protect mode." In a self-protect mode, the cooling fans in the tape drive canister are turned off to prevent condensation by keeping warm and moist air from entering the tape drives. The tape drive internal temperature rises when cooling fans in the tape drive canister are turned off. The increase in the tape drive internal temperature decreases the probability that the sensitive head component is below the dew point temperature so that condensation is less likely to occur. However, the tape drive internal electronics eventually reach the maximum operating temperature when the tape drive canister's cooling fans are turned off. In response to reaching the tape drive internal electronics' maximum operating temperature, the tape drive canister's cooling fans turn on for a sufficient time to cool down the internal electronics. The tape drive canister's cooling fans draw the moist, ambient air into the tape drive, but the head component is warmed to above the dew point temperature. In response to the tape drive internal electronics cooling off, the tape drive canister's cooling fans turn off. The tape drive canisters in a self-protect mode continue this on-off cycling as long as the tape drive canisters are in self-protect mode.

A drawback to this attempted approach is that the self-protect mode may not sufficiently prevent condensation on the head element if the tape drive canister cooling fans are turned on before the internal temperatures have risen to above the dew point of the outside air.

Moreover, the swings in temperature are more likely to cause thermal degradation of the sensitive drive components. Additionally, repeatedly raising and lowering the temperatures in the self-protect mode may create stress on the components and/or solder joints of the tape drive internal electronics. Stress on the components and/or solder joints of the tape drive internal electronics may lower the long-term reliability of the tape drive.

SUMMARY

An air curtain canister for creating an air curtain, according to one approach, includes a housing having a form factor approximating an exterior of a data storage drive. The air curtain canister also includes a fan for creating an airflow in the housing and a nozzle for directing the airflow exiting the housing in a predefined trajectory for creating an air curtain. The air curtain canister provides the benefit of an air curtain which reduces the amount of warmer and/or more humid outside air that reaches sensitive tape drive components located behind the air curtain.

An air curtain canister may optionally include a cold air inlet for receiving relatively cooler air for mixing with the air in the airflow. The cold air inlet provides the benefit of supplying the library and the air curtain with relatively cooler air in order to control the environment of the data storage library.

An air curtain canister may optionally include a velocity of air in the air curtain sufficient to create a barrier to outside air. The velocity of air in the air curtain provides the benefit of preventing relatively warmer outside air from reaching components located behind the air curtain and damaging the sensitive tape drive components.

A data storage library according to one approach includes an array of drive slots each configured to receive a data storage drive therein. The data storage library also includes a plurality of air curtain canisters positioned laterally in the array of drive slots for creating an air curtain across a front of the remaining drive slots in the array. The data storage library provides the benefit of an air curtain which reduces the amount of warmer and/or more humid outside air that reaches sensitive tape drive components located behind the air curtain.

Each air curtain canister may optionally include a housing having a form factor approximating an exterior of a data storage drive. The air curtain canister also includes a fan for creating an airflow in the housing and a nozzle for directing the airflow exiting the housing in a predefined trajectory for creating an air curtain. The air curtain canisters provide the benefit of an air curtain which serves as a barrier between outside air and sensitive tape drive components located behind the air curtain.

The air curtain canisters are preferably positioned to create a full air curtain across the entire front of the occupied drive slots. The volume of air entering the air curtain is optionally at least as great as a volume of air the drives in the drive slots cumulatively draw. The full air curtain across the entire front of the occupied drive slots may provide the benefit of a sufficient area and volume of air such that the air curtain prevents intermixing of outside air and air in the air curtain.

A method according to one approach includes selectively instructing air curtain canisters in a data storage library to create an air curtain across a front of an array of drive slots in the data storage library. The method provides the benefit of an air curtain which serves as a barrier between outside air and sensitive tape drive components located behind the air curtain.

The air curtain canisters may optionally be instructed to run continuously when a continuous mode is active. The air curtain canisters may also and/or alternatively be instructed to run in response to a trigger condition when a recirculating mode is active. The continuous mode provides the benefit of more constant environmental control within the data storage library. The recirculation mode provides the benefit of environmental control which responds to a trigger condition such as the opening of the data storage library door, thereby saving power.

A method may optionally include instructing the air curtain canister to run continuously in a continuous mode. Cooler air is selectively added to air being moved by at least some of the air curtain canisters for cooling the air based on at least one factor. The factor may be selected from the group consisting of: a temperature reading of the air and a humidity reading of the air. Selectively adding cooler air to air being moved by at least some of the air curtain canisters for cooling the air provides the benefit of providing more control over the temperature and/or humidity within the data storage library.

Other aspects and approaches of the present invention will become apparent from the following detailed description, which, when taken in conjunction with the drawings, illustrate by way of example the principles of the invention.

BRIEF DESCRIPTION OF THE DRAWINGS

FIGS. 8A-8D are partial side views of a cartridge blocking mechanism according to one approach.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred approaches of data storage systems and apparatuses for creating air curtains, as well as operation and/or component parts thereof.

In one general approach, an air curtain canister for creating an air curtain includes a housing having a form factor approximating an exterior of a data storage drive. The air curtain canister also includes a fan for creating an airflow in the housing and a nozzle for directing the airflow exiting the housing in a predefined trajectory for creating an air curtain.

In another general approach, a data storage library includes an array of drive slots each configured to receive a data storage drive therein. The data storage library also includes a plurality of air curtain canisters positioned laterally in the array of drive slots for creating an air curtain across a front of the remaining drive slots in the array.

In yet another general approach, a method includes selectively instructing air curtain canisters in a data storage library to create an air curtain across a front of an array of drive slots in the data storage library.

Figure 1:
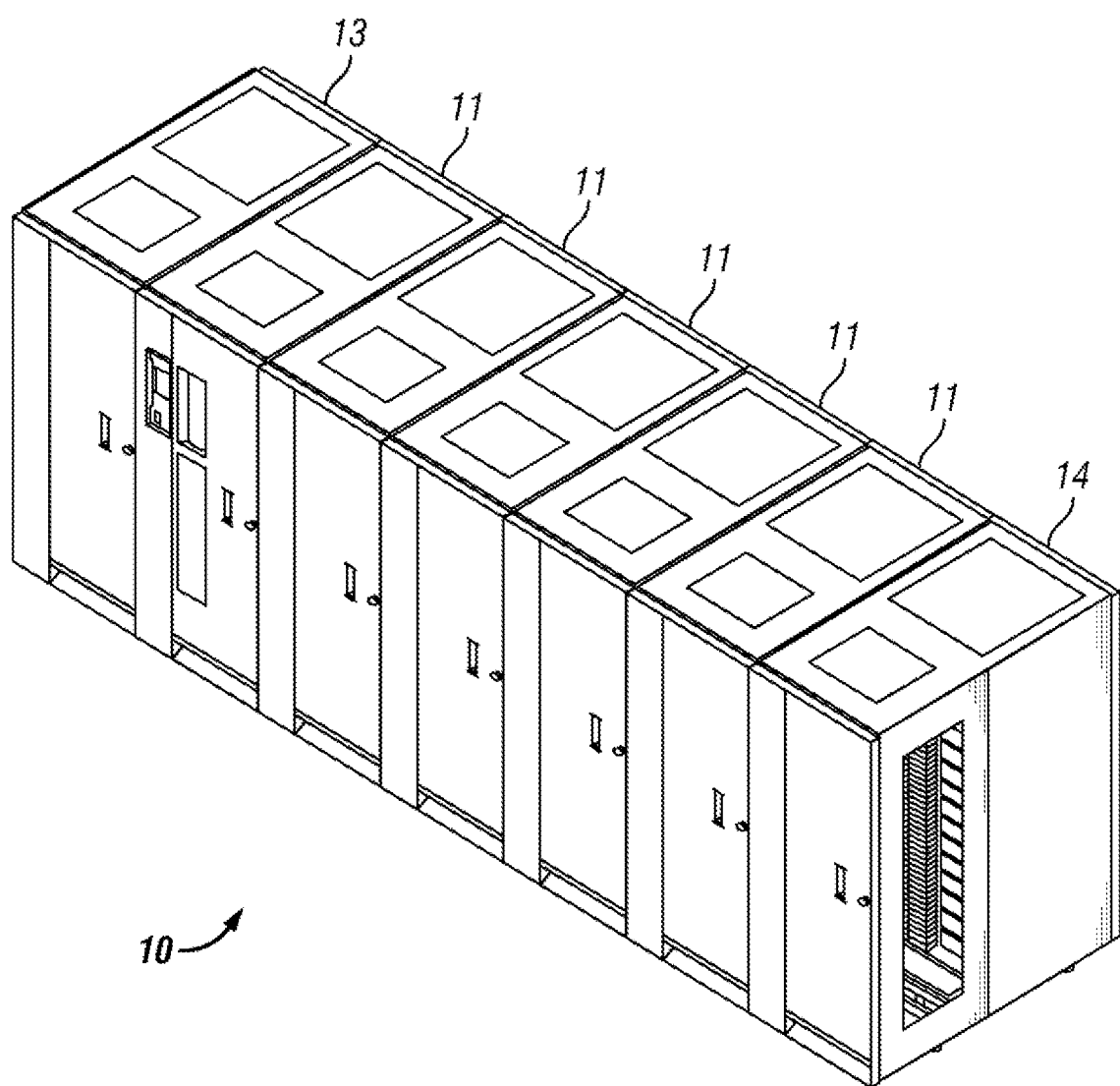
FIG. 1 is a perspective view of an automated data storage library according to one approach.
Figure 2:
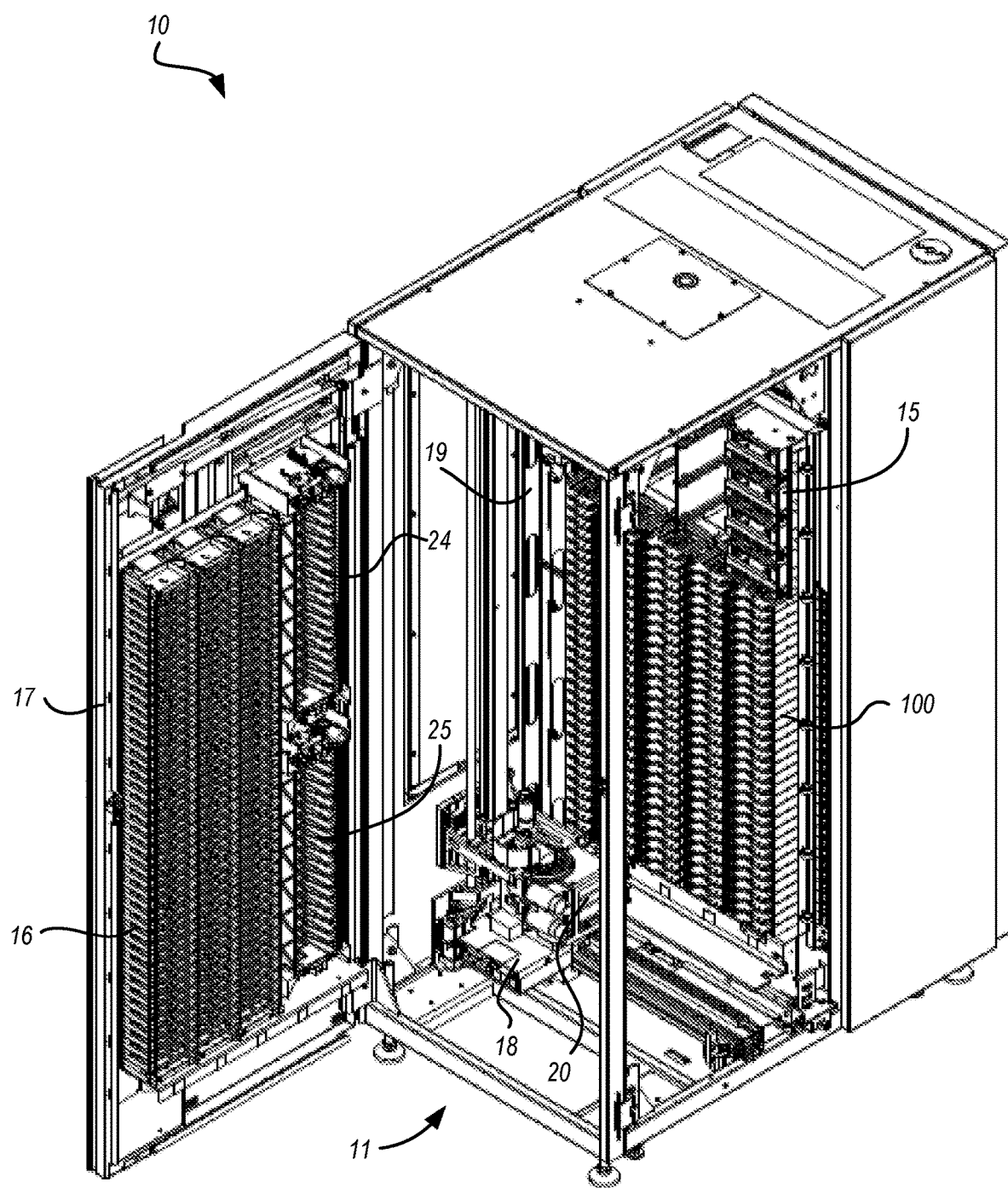
FIG. 2 is a perspective view of a storage frame from the data storage library of FIG. 1.

FIGS. 1-2 illustrate an automated data storage library 10 which stores and retrieves data storage cartridges, containing data storage media (not shown), from multi-cartridge deep slot cells 100 and single cartridge storage slots 16. An example of an automated data storage library which has a similar configuration as that depicted in FIGS. 1-2, and may be implemented with some of the various aspects herein is the IBM 3584 UltraScalable Tape Library. Moreover, it should be noted that references to "data storage media" herein refer to data storage cartridges, and for purposes of the present application, the two terms may be used synonymously.

The library 10 of FIG. 1 comprises a left hand service bay 13, one or more storage frames 11, and right hand service bay 14. As will be discussed in further detail below, a frame may comprise an expansion component of the library. Thus, storage frames may be added or removed to expand or reduce the size and/or functionality of the library. According to different approaches, frames may include additional storage slots, deep slot cells, drives, import/export stations, accessors, operator panels, etc.

FIG. 2 shows an exemplary approach of a storage frame 11, which acts as the base frame of the library 10. Moreover, the storage frame 11 illustrated in FIG. 2 is contemplated to be a minimum configuration of the library 10, for which there is only a single accessor 18 (i.e., there are no redundant accessors) and no service bay. However, in other approaches, a storage frame may include multiple robotic accessors and/or service bays.

Looking to FIG. 2, the library 10 is arranged for accessing data storage media in response to commands from at least one external host system (not shown). The library 10 includes a plurality of storage slots 16 on front wall 17 and a plurality of multi-cartridge deep slot cells 100 on rear wall 19, both of which may be used for storing data storage cartridges that may contain data storage media. According to one approach, the storage slots 16 are configured to store a single data storage cartridge, and the multi-cartridge deep slot cells 100 are configured to store a plurality of data storage cartridges. In a preferred approach, the multi-cartridge deep slot cells may be arranged in sequential order of tiers from front to rear (e.g., see FIG. 7A).

With continued reference to FIG. 2, the storage frame 11 of the library 10 also includes at least one data storage drive 15, e.g., for reading and/or writing data with respect to the data storage media. Additionally, a first accessor 18 may be used to transport data storage media between the plurality of storage slots 16, the multi-cartridge deep slot cells, and/or the data storage drive(s) 15. According to various aspects, the data storage drives 15 may be optical disc drives, magnetic tape drives, solid state drives having nonvolatile random access memory (NVRAM) such as Flash memory, or other types of data storage drives as are used to read and/or write data with respect to the data storage media.

As illustrated, the storage frame 11 may optionally include an operator panel or other user interface, such as a web-based interface, which allows a user to interact with the library 10. The storage frame 11 may also optionally comprise an upper I/O station 24 and/or a lower I/O station 25, thereby allowing data storage cartridges to be added (e.g., inserted) to the library inventory and/or removed from the library without disrupting library operation. Furthermore, the library 10 may have one or more storage frames 11, each having storage slots 16, preferably accessible by the first accessor 18.

As described above, the storage frames 11 may be configured with different components depending upon the intended function. One configuration of storage frame 11 may comprise storage slots 16 and/or multi-cartridge deep slot cells 100, data storage drive(s) 15, and other optional components to store and retrieve data from the data storage cartridges. However, in another approach, a storage frame 11 may include storage slots 16 and/or multi-cartridge deep slot cells 100 and no other components. The first accessor 18 may have a gripper assembly 20, e.g., for gripping one or more data storage media, in addition to having a bar code scanner or other reading system, such as a cartridge memory reader or similar system mounted on the gripper assembly 20, to "read" identifying information about the data storage media.

Figure 3:
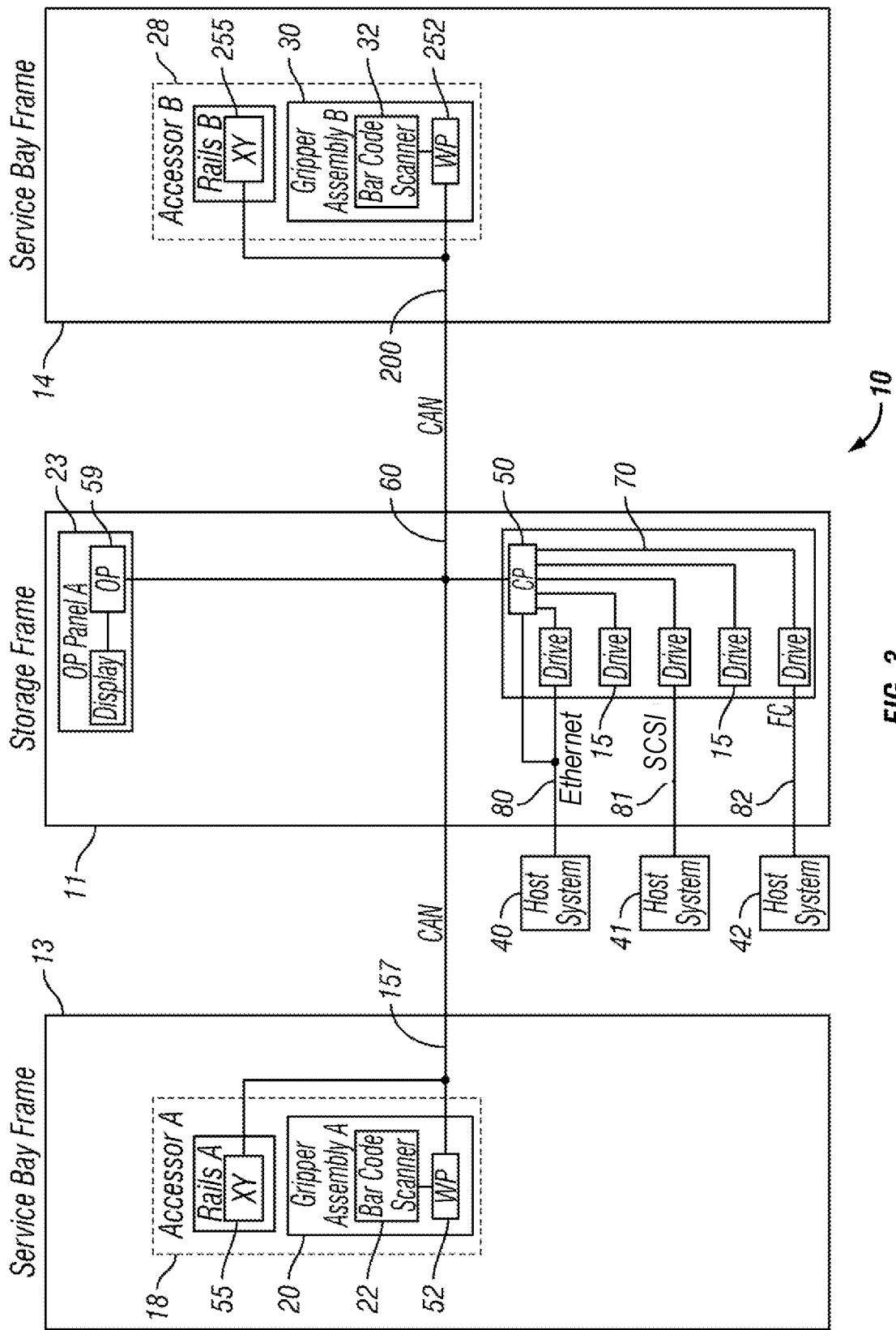
FIG. 3 is a block diagram of an automated data storage library according to one approach.

FIG. 3 depicts an automated data storage library 10, in accordance with one approach. As an option, the present automated data storage library 10 may be implemented in conjunction with features from any other approach listed herein, such as those described with reference to the other FIGS. Of course, however, such automated data storage library 10 and others presented herein may be used in various applications and/or in permutations which may or may not be specifically described in the illustrative configurations listed herein. Further, the automated data storage library 10 presented herein may be used in any desired environment. Thus FIG. 3 (and the other FIGS.) should be deemed to include any and all possible permutations.

Referring now to FIG. 3, the automated data storage library 10 as described in reference to FIGS. 1 and 2, is depicted according to one approach. According to a preferred approach, the library 10 may employ a controller, e.g., arranged as a distributed system of modules with a plurality of processor nodes.

In one configuration, the library is controlled, not by a central controller, but rather, by a distributed control system for receiving logical commands and converting the commands to physical movements of the accessor and gripper, and for operating the drives in accordance with the desired physical movements. The distributed control system may also provide logistical support, such as responding to host requests for element status, inventory, library status, etc. The specific commands, the conversion of those commands to physical movements, and the operation of the drives may be of a type known to those of skill in the art.

While the automated data storage library 10 has been described as employing a distributed control system, various other approaches described and/or suggested herein may be implemented in automated data storage libraries regardless of control configuration, such as, but not limited to, an automated data storage library having one or more library controllers that are not distributed.

Referring still to FIG. 3, the library 10 may have one or more storage frames 11, a left hand service bay 13 and a right hand service bay 14. The left hand service bay 13 is shown with a first accessor 18, where, as discussed above, the first accessor 18 may include a gripper assembly 20 and/or a bar code scanner (e.g., reading system) to "read" identifying information about the data storage media depending on the desired approach. Furthermore, the right hand service bay 14 is shown having a second accessor 28, which includes a gripper assembly 30 and may also include a reading system 32 to "read" identifying information about the data storage media.

According to one approach, in the event of a failure or other unavailability of the first accessor 18, or its gripper assembly 20, etc., the second accessor 28 may perform some or all of the functions of the first accessor 18. Thus in different approaches, the two accessors 18, 28 may share one or more mechanical paths, they may have completely independent mechanical paths, or combinations thereof. In one example, the accessors 18, 28 may have a common horizontal rail with independent vertical rails to travel thereal-ong. Moreover, it should be noted that the first and second accessors 18, 28 are described as first and second for descriptive purposes only and this description is not meant to limit either accessor to an association with either the left hand service bay 13, or the right hand service bay 14.

In an exemplary approach which is in no way intended to limit the invention, the first and second accessors 18, 28 may preferably move their grippers in at least two directions, called the horizontal "X" direction and vertical "Y" direction, e.g., to retrieve and grip, deliver and release, load and unload, etc. the data storage cartridge at the storage slots 16, multi-cartridge deep slot cells 100, data storage drives 15, etc.

With continued reference to FIG. 3, library 10 receives commands from one or more host systems 40, 41, 42. The host systems 40, 41, 42, such as host servers, communicate with the library directly, e.g., on path 80, through one or more control ports (not shown), or through one or more data storage drives 15 on paths 81, 82. Thus, in different approaches, the host systems 40, 41, 42 may provide commands to access particular data storage cartridges and move the cartridges, for example, between the storage slots 16 and the data storage drives 15. The commands are typically logical commands identifying the cartridges or cartridge media, and/or logical locations for accessing the media. Furthermore, it should be noted that the terms "commands" and "work requests" are used interchangeably herein to refer to such communications from the host system 40, 41, 42 to the library 10 as are intended to result in accessing particular data storage media within the library 10 depending on the desired approach.

According to one approach, the library 10 may be controlled by a library controller. Moreover, in various aspects, the library controller may include a distributed control system receiving the logical commands from hosts, determining the required actions, and/or converting the actions to physical movements of the first and/or second accessor 18, 28. In another approach, the distributed control system may have a plurality of processor nodes, each having one or more computer processors. According to one example of a distributed control system, a communication processor node 50 may be located in a storage frame 11. The communication processor node provides a communication link for receiving the host commands, either directly or through the drives 15, via at least one external interface, e.g., coupled to line 80.

Still referring to FIG. 3, the communication processor node 50 may additionally provide a communication link 70 for communicating with the data storage drives 15. As illustrated, the communication processor node 50 may preferably be located in the storage frame 11, e.g., close to the data storage drives 15. Furthermore, one or more additional work processor nodes may be provided to form an exemplary distributed processor system, which may comprise, e.g., a work processor node 52 located at first accessor 18, and that is coupled to the communication processor node 50 via a network 60, 157. According to different approaches, each work processor node may respond to received commands that are broadcast thereto from any communication processor node, and the work processor nodes may also direct the operation of the accessors, e.g., providing move commands. An XY processor node 55 may be provided and may be located at an XY system of first accessor 18. As illustrated, the XY processor node 55 is coupled to the network 60, 157, and is responsive to the move commands, operating the XY system to position the gripper assembly 20.

Also, an operator panel processor node 59 may be provided at the optional operator panel for providing an interface for communicating between the operator panel and the communication processor node 50, the work processor nodes 52, 252, and the XY processor nodes 55, 255.

A network 60, for example comprising a common bus, is provided, coupling the various processor nodes. The network may comprise a robust wiring network, such as the commercially available Controller Area Network (CAN) bus system, which is a multi-drop network, having a standard access protocol and wiring standards, for example, as defined by CiA, the CAN in Automation Association, Am Weich Selgarten 26, D-91058 Erlangen, Germany. Other networks, such as Ethernet, or a wireless network system, such as RF or infrared, may be employed in the library as is known to those of skill in the art. In addition, multiple independent networks may also be used to couple the various processor nodes.

As illustrated in FIG. 3, the communication processor node 50 is coupled to each of the data storage drives 15 of a storage frame 11, via lines 70, and are thereby communicating with the drives 15 and with host systems 40, 41, 42. Alternatively, the host systems 40, 41, 42 may be directly coupled to the communication processor node 50, at input 80 for example, or to control port devices (not shown) which connect the library to the host system(s) with a library interface similar to the drive/library interface. As is known to those of skill in the art, various communication arrangements may be employed for communication with the hosts and with the data storage drives. In the example of FIG. 3, host connections 80 and 81 are intended to be Ethernet and a SCSI bus, respectively, e.g., and may serve as host connections. However, bus 82 comprises an example of a Fibre Channel bus which is a high speed serial data interface, allowing transmission over greater distances than the SCSI bus systems.

According to some approaches, the data storage drives 15 may be in close proximity to the communication processor node 50, and may employ a short distance communication scheme, such as Ethernet, or a serial connection, such as RS-422. Thus the data storage drives 15 may be individually coupled to the communication processor node 50 by lines 70. Alternatively, the data storage drives 15 may be coupled to the communication processor node 50 through one or more networks.

Furthermore, additional storage frames 11 may be provided, whereby each is preferably coupled to the adjacent storage frame. According to various aspects, any of the additional storage frames 11 may include communication processor nodes 50, storage slots 16, data storage drives 15, networks 60, etc.

Moreover, as described above, the automated data storage library 10 may comprise a plurality of accessors. A second accessor 28, for example, is shown in a right hand service bay 14 of FIG. 3. The second accessor 28 may include a gripper assembly 30 for accessing the data storage media, and an XY system 255 for moving the second accessor 28. The second accessor 28 may run on the same horizontal mechanical path as the first accessor 18, and/or on an adjacent (e.g., separate) path. Moreover the illustrative control system additionally includes an extension network 200 which forms a network coupled to network 60 of the storage frame(s) 11 and to network 157 of left hand service bay 13.

In FIG. 3 and the accompanying description, the first and second accessors are associated with the left hand service bay 13 and the right hand service bay 14 respectively. However, this is for illustrative purposes and there may not be an actual association. Thus, according to another approach, network 157 may not be associated with the left hand service bay 13 and network 200 may not be associated with the right hand service bay 14. Moreover, depending on the design of the library, it may not be necessary to have a left hand service bay 13 and/or a right hand service bay 14 at all.

An automated data storage library 10 typically comprises one or more controllers to direct the operation of the automated data storage library. Moreover, host computers and data storage drives typically include similar controllers. A library controller may take many different forms and may comprise, for example, but is not limited to, an embedded system, a distributed control system, a personal computer, a workstation, etc. The term "library controller" as used herein is intended in its broadest sense as a device that includes at least one processor, and optionally further circuitry and/or logic, for controlling and/or providing at least some aspects of library operations.

Figure 4:
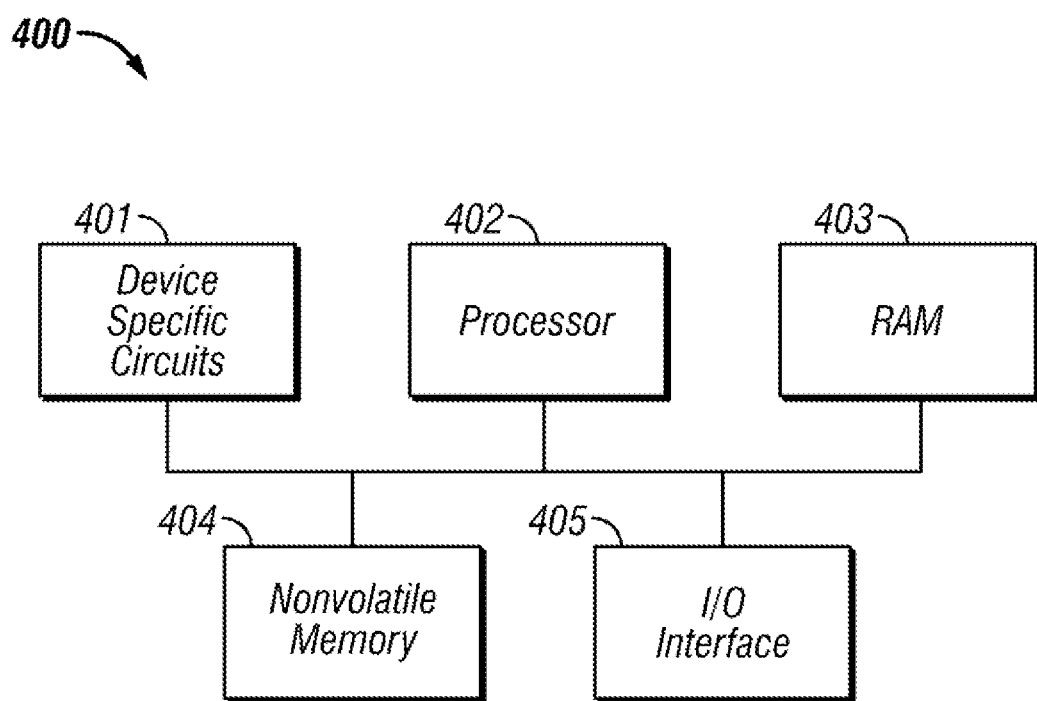
FIG. 4 is a block diagram depicting a controller configuration according to one approach.

Referring now to FIG. 4, a typical controller 400 is shown with a processor 402, Random Access Memory (RAM) 403, nonvolatile memory 404, device specific circuits 401, and I/O interface 405. Alternatively, the RAM 403 and/or nonvolatile memory 404 may be contained in the processor 402 as could the device specific circuits 401 and I/O interface 405. The processor 402 may comprise, for example, an off-the-shelf microprocessor, custom processor, Field Programmable Gate Array (FPGA), Application Specific Integrated Circuit (ASIC), discrete logic, etc. The RAM 403 is typically used to hold variable data, stack data, executable instructions, etc.

According to various aspects, the nonvolatile memory 404 may comprise any type of nonvolatile memory such as, but not limited to, Electrically Erasable Programmable Read Only Memory (EEPROM), flash Programmable Read Only Memory (PROM), battery backup RAM, hard disk drives, etc. However, the nonvolatile memory 404 is typically used to hold the executable firmware and any nonvolatile data. Moreover, the I/O interface 405 comprises a communication interface that allows the processor 402 to communicate with devices external to the controller. Examples may comprise, but are not limited to, serial interfaces such as RS-232, USB (Universal Serial Bus) or Small Computer Systems Interface (SCSI). The device specific circuits 401 provide additional hardware to enable the controller 400 to perform unique functions including, but not limited to, motor control of a cartridge gripper. Moreover, the device specific circuits 401 may include electronics that provide, by way of example but not limitation, Pulse Width Modulation (PWM) control, Analog to Digital Conversion (ADC), Digital to Analog Conversion (DAC), etc. In addition, all or part of the device specific circuits 401 may reside outside the controller 400.

While the automated data storage library 10 is described as employing a distributed control system, the various aspects described and/or suggested herein may be implemented in various automated data storage libraries regardless of control configuration, including, but not limited to, an automated data storage library having one or more library controllers that are not distributed. Moreover, a library controller may comprise one or more dedicated controllers of a library, depending on the desired approach. For example, there may be a primary controller and a backup controller. In addition, a library controller may comprise one or more processor nodes of a distributed control system. According to one example, communication processor node 50 (e.g., of FIG. 3) may comprise the library controller while the other processor nodes (if present) may assist the library controller and/or may provide backup or redundant functionality. In another example, communication processor node 50 and work processor node 52 may work cooperatively to form the library controller while the other processor nodes (if present) may assist the library controller and/or may provide backup or redundant functionality. Still further, all of the processor nodes may comprise the library controller. According to various aspects described and/or suggested herein, a library controller may have a single processor or controller, or it may include multiple processors or controllers.

Figure 5A:
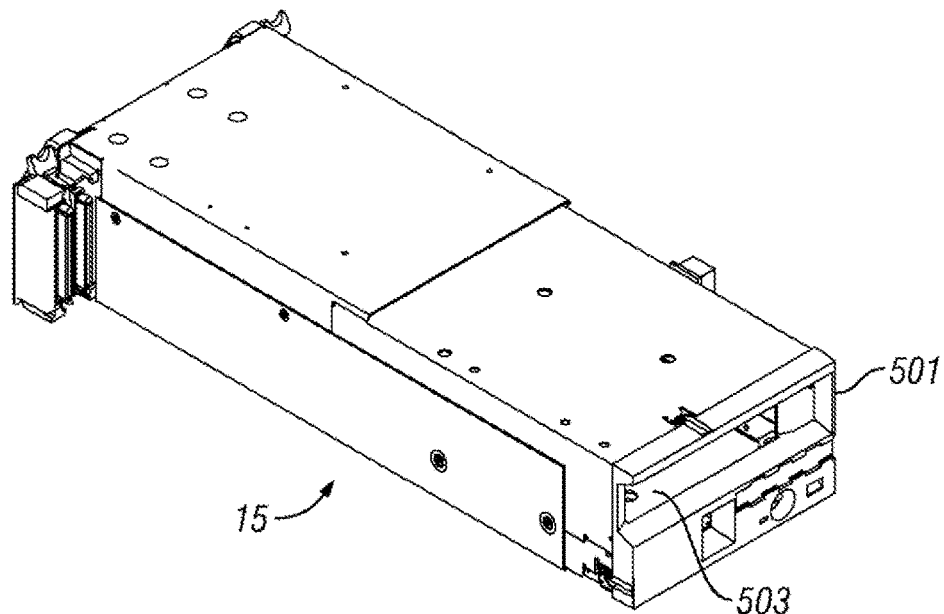
FIG. 5A is a front perspective view of a data storage drive according to one approach.
Figure 5B:
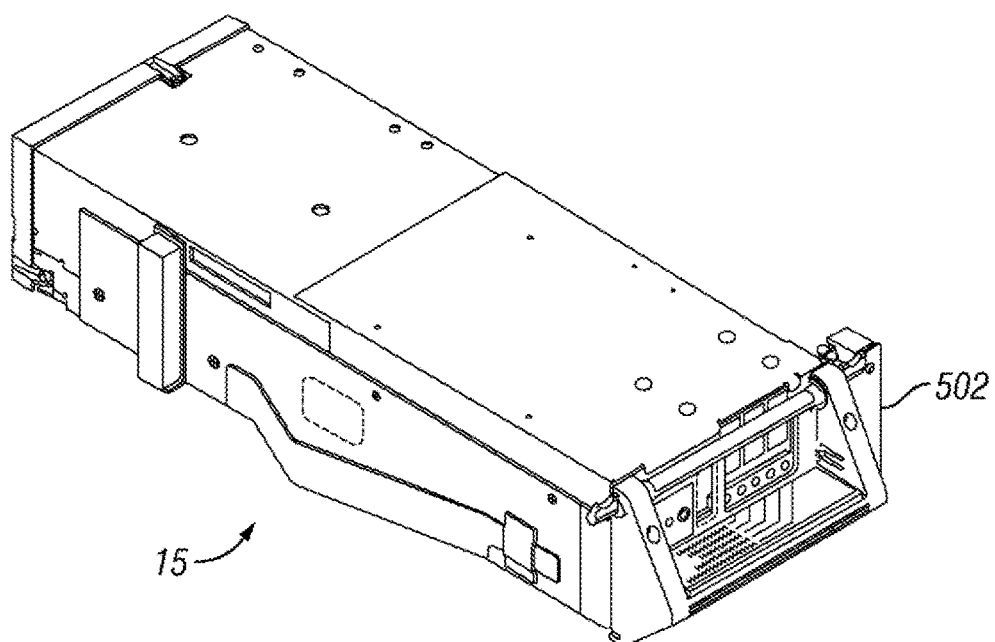
FIG. 5B is a rear perspective view of the data storage drive of FIG. 5A.

FIGS. 5A-5B illustrate the front 501 and rear 502 views of a data storage drive 15, according to one approach. In the example depicted in FIGS. 5A-5B, the data storage drive 15 comprises a hot-swap drive canister, which is in no way intended to limit the invention. In fact, any configuration of data storage drive may be used whether or not it includes a hot-swap canister. As discussed above, a data storage drive 15 is used to read and/or write data with respect to the data storage media, and may additionally communicate with a memory which is separate from the media, and is located within the cartridge. Thus, according to one approach, a data storage cartridge may be placed into the data storage drive 15 at opening 503.

Figure 6:
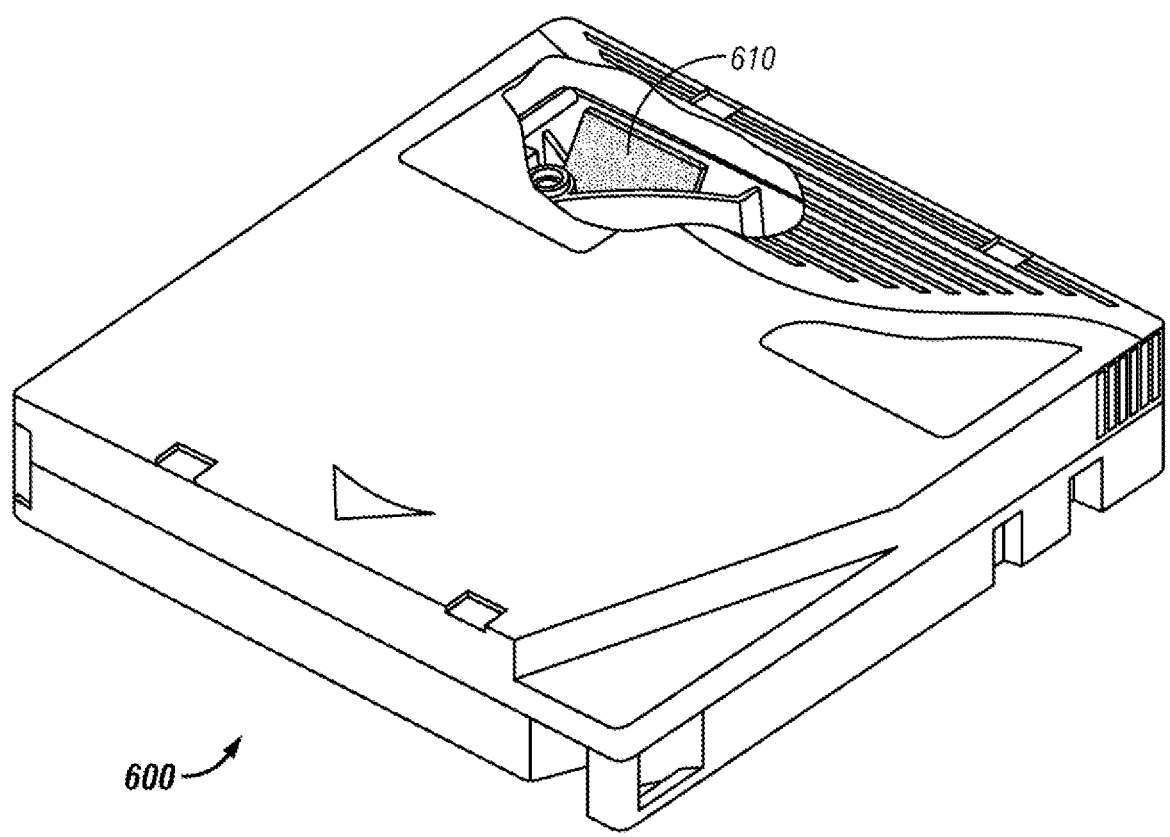
FIG. 6 is perspective view of a data storage cartridge having a cutaway portion, according to one approach.

Furthermore, FIG. 6 illustrates an approach of a data storage cartridge 600 with a cartridge memory 610 shown in a cutaway portion of the Figure, which is in no way intended to limit the invention. In fact, any configuration of data storage cartridge may be used whether or not it comprises a cartridge memory. According to various aspects, media of the data storage cartridge media may include any type of media on which data may be stored, including but not limited to magnetic media, e.g., magnetic tape, disks, etc.; optical media, e.g., optical tape, discs, etc.; electronic media, e.g., PROM, EEPROM, flash PROM, CompactFlash™, Smartmedia™, Memory Stick™, etc.; etc., or other suitable media. Moreover, an example of a data storage cartridge that is widely employed in automated data storage libraries for mass data storage is a magnetic tape cartridge in which the media is magnetic tape.

Figure 7A:
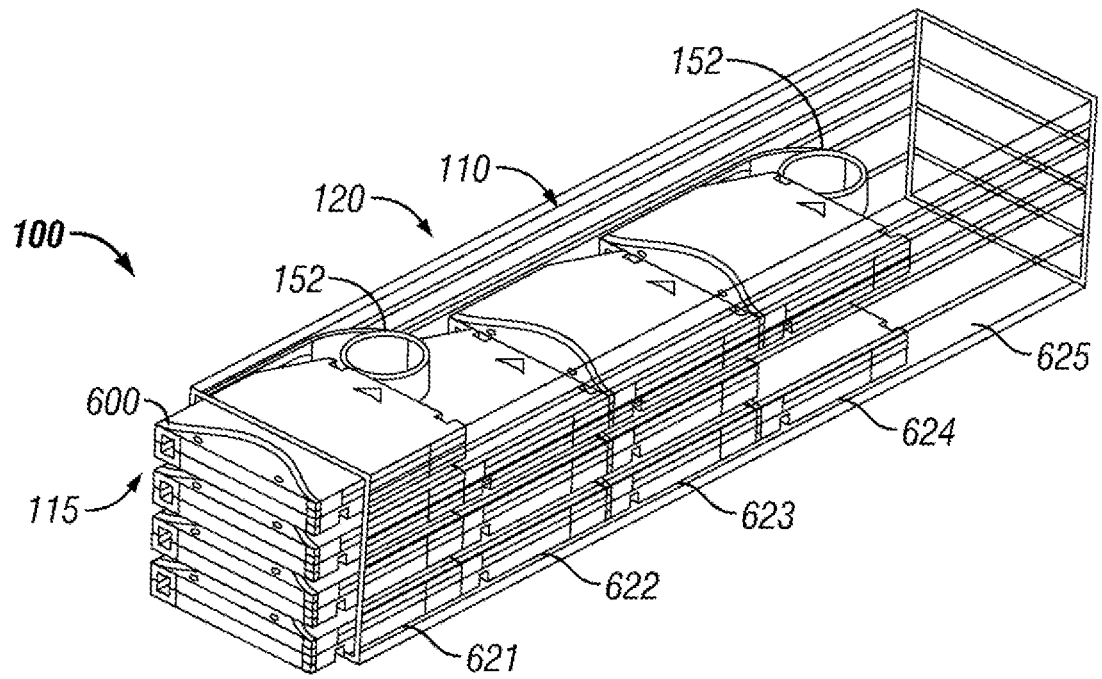
FIGS. 7A-7B are perspective views of a multi-cartridge deep slot cell according to one approach.
Figure 7B:
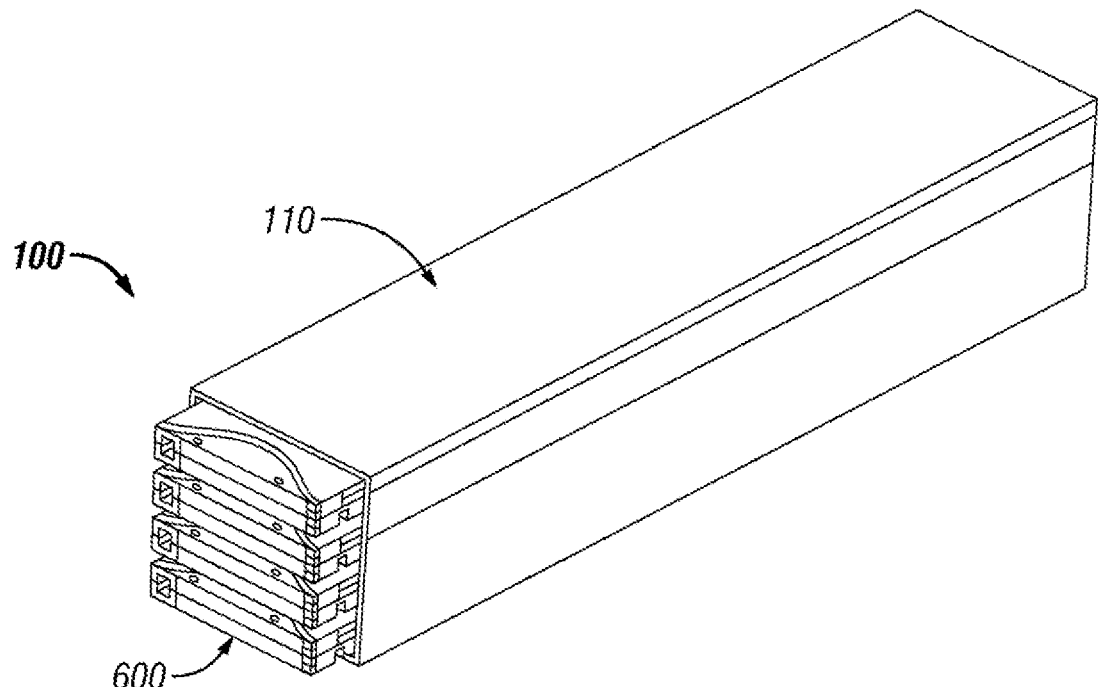

Looking now to FIGS. 7A-7B, a multi-cartridge deep slot cell 100 having biasing springs 152 is depicted according to one approach. As shown in the illustrative configuration, the multi-cartridge deep slot cell 100 comprises a housing 110 defining an interior space 115. Furthermore, a plurality of storage slots 120 is disposed within the housing, and may be configured for storing up to a plurality of data storage cartridges 600, depending on the desired approach. Alternatively, the multi-cartridge deep slot cell 100 may be built into the frame of the automated data storage library according to one approach.

FIGS. 8A-8D illustrate an approach of a cartridge blocking mechanism 150 having a retaining gate 660 that retains the data storage cartridges in the multi-cartridge deep slot cell 100 according to one approach. As illustrated, according to one approach, the retaining gate 660 may be externally attached to a multi-cartridge deep slot cell 100, relative to a front opening of the multi-cartridge deep slot cell 100, whereby the retaining gate 660 can be activated by an accessor 18, e.g., of an automated tape library. Moreover, the retaining gate 660 allows for positive cartridge retention against the pressure of biasing springs (see 152 of FIGS. 7A-7B), and ensures that one or more data storage cartridges do not get pushed out of the multi-cartridge deep slot cell 100 simultaneously, while allowing the pushing mechanism (not shown) of the multi-cartridge deep slot cell 100 to continuously push data storage cartridge(s) to the opening in a multi-cartridge deep slot cell 100. Thus, according to one approach, the accessor 18 may open the retaining gate to gain access to the data storage cartridge in tier 1 and, upon its extraction, the biasing spring 152 moves the cartridge(s) positioned behind the extracted cartridge forward, thereby promoting the cartridge(s) by one tier as will soon become apparent.

The basic working of the retaining gate is that the gate prevents the data storage cartridge(s) from being pushed out of a multi-cartridge deep slot cell 100. For example, as shown in FIGS. 8A-8D, a retaining gate 660 can be lifted by, for example, accessor 18 or by a front storage cartridge 642 for cartridge removal from/insertion into a multi-cartridge deep slot cell 100. Specifically, retaining gate 660 has a pivoting arm 661 mounted on multi-cartridge deep slot cell 100 via a pivoting post (not shown) that can be integral to a construction of multi-cartridge deep slot cell 100. Pivoting arm 661 is located below a catch 662 of retaining gate 660 whereby a thrust force TF through data storage cartridge 644-642 caused by the pushing mechanism (not shown) of multi-cartridge deep slot cell 100 causes retaining gate 660 to stay closed in a retaining position as shown in FIG. 8A. Moreover, the retaining gate 660 is preferably biased such that it closes in the downward direction over the front opening of multi-cartridge deep slot cell 100. This constant biasing may be achieved via gravity as shown in FIG. 8A or by implementing a spring force, e.g., attached to retaining gate 660 (not shown).

For removal of front storage cartridge 642 by accessor 18 from multi-cartridge deep slot cell 100, retaining gate 660 must be lifted upward to a releasing position whereby catch 662 of retaining gate 660 is disengaged from front storage cartridge 642. This can be seen in FIG. 8B where accessor 18 interfaces with retaining gate 660 by providing a lifting force. Once retaining gate 660 is lifted to the releasing position and accessor 18 is engaged with storage cartridge 642, accessor 18 can pull storage cartridge 642 out of multi-cartridge deep slot cell 100 and into accessor 18 without any interference of retaining gate 660 as shown in FIG. 8C. In view of storage cartridges 644 and 643 being stored in multi-cartridge deep slot cell 100, retaining gate 660 must return to its retaining position to prevent storage cartridges 644 and 643 from being ejected from multi-cartridge deep slot cell 100 by the thrust force TF of the pushing mechanism (not shown). During extraction of front storage cartridge 642 through the front opening of multi-cartridge deep slot cell 100, the retaining gate 660, which is being biased downward, moves back to the retaining position to engage storage cartridge 643.

Once front storage cartridge 642 is extracted and storage cartridges 643 and 644 are retained from being pushed out of multi-cartridge deep slot cell 100, retaining gate 660 has successfully completed its cartridge retrieval process. Now retaining gate 660 demonstrates its ability to work for cartridge insertion into multi-cartridge deep slot cell 100. When accessor 18 begins to insert storage cartridge 642 back into multi-cartridge deep slot cell 100, retaining gate 660 is lifted to its releasing position to allow storage cartridge 642 through the front opening of multi-cartridge deep slot cell 100. Catch 662 of retaining gate 660 interfaces with a rear portion of storage cartridge 642, in particular a beveled surface of catch 662 as shown in FIG. 8D, whereby retaining gate 660 is lifted to its releasing position as shown in FIG. 8B due to storage cartridge 642 being pushed in multi-cartridge deep slot cell 100 by accessor 18. In doing so, storage cartridges 644, 643 are pushed deeper into multi-cartridge deep slot cell 100 by storage cartridge 642 in multi-cartridge deep slot cell 100 by accessor 18. Thus, the accessor is able to provide a force greater than the thrust force TF antiparallel thereto, to overcome the directional biasing of the storage cartridges 644, 643. Upon full insertion into multi-cartridge deep slot cell 100, retaining gate 660 moves to its retaining position to engage storage cartridge 642 as shown in FIG. 8A.

Thus, looking to various aspects presented herein, access to a storage slot may include the ability to remove a cartridge from a storage slot, the ability to place a cartridge into a storage slot, or combinations thereof.

According to an exemplary approach, the storage slots from top to bottom are considered to be in parallel and comprise the same tier. Moreover, the storage slots from front to back, in a particular row, are considered to be in series and comprise sequential tiers.

Referring back to FIGS. 7A-7B, in accordance with one approach, storage slots 120 are depicted as being configured for storing up to a plurality of data storage cartridges 600, and arranged in sequential order of tiers 621, 622, 623, 624, 625 from front to rear. It should be noted that the frontmost tier 621 is also called "tier 1", while the next tier 622 is called "tier 2", etc., and the last tier 625 is also called the "rearmost" tier. However, referring to FIG. 2, in one approach, the single cartridge storage slots 16 are also termed "tier 0".

Referring again to FIGS. 1-3, according to one approach, the controller of automated data storage library 10 may operate the accessor(s) 18, 28 to selectively extract, place and/or transport data storage cartridges with respect to the multi-cartridge deep slot cells 100 and/or other elements of the automated data storage library 10. For example, the controller may facilitate extracting a cartridge from a multi-cartridge deep slot cell 100, transporting the cartridge to a data storage drive 15 and placing the cartridge in the drive 15. The controller may then extract the cartridge from the data storage drive 15, while directing the accessor to transport the cartridge to a specific multi-cartridge deep slot cell 100, and place the cartridge therein.

In one configuration, one or more data storage cartridges may be added into the library, e.g., at an I/O station 24, 25, whereby the controller of the automated data storage library 10 may then operate the accessor(s) 18, 28 to transport the cartridge(s) to specific multi-cartridge deep slot cell(s) 100, and place the cartridge(s) therein. Similarly, the controller may operate the accessor(s) to selectively extract, place and transport data storage cartridges with respect to the single cartridge storage slots 16, and/or transport inserted or added cartridge(s) to specific single cartridge storage slots 16.

Figure 9:
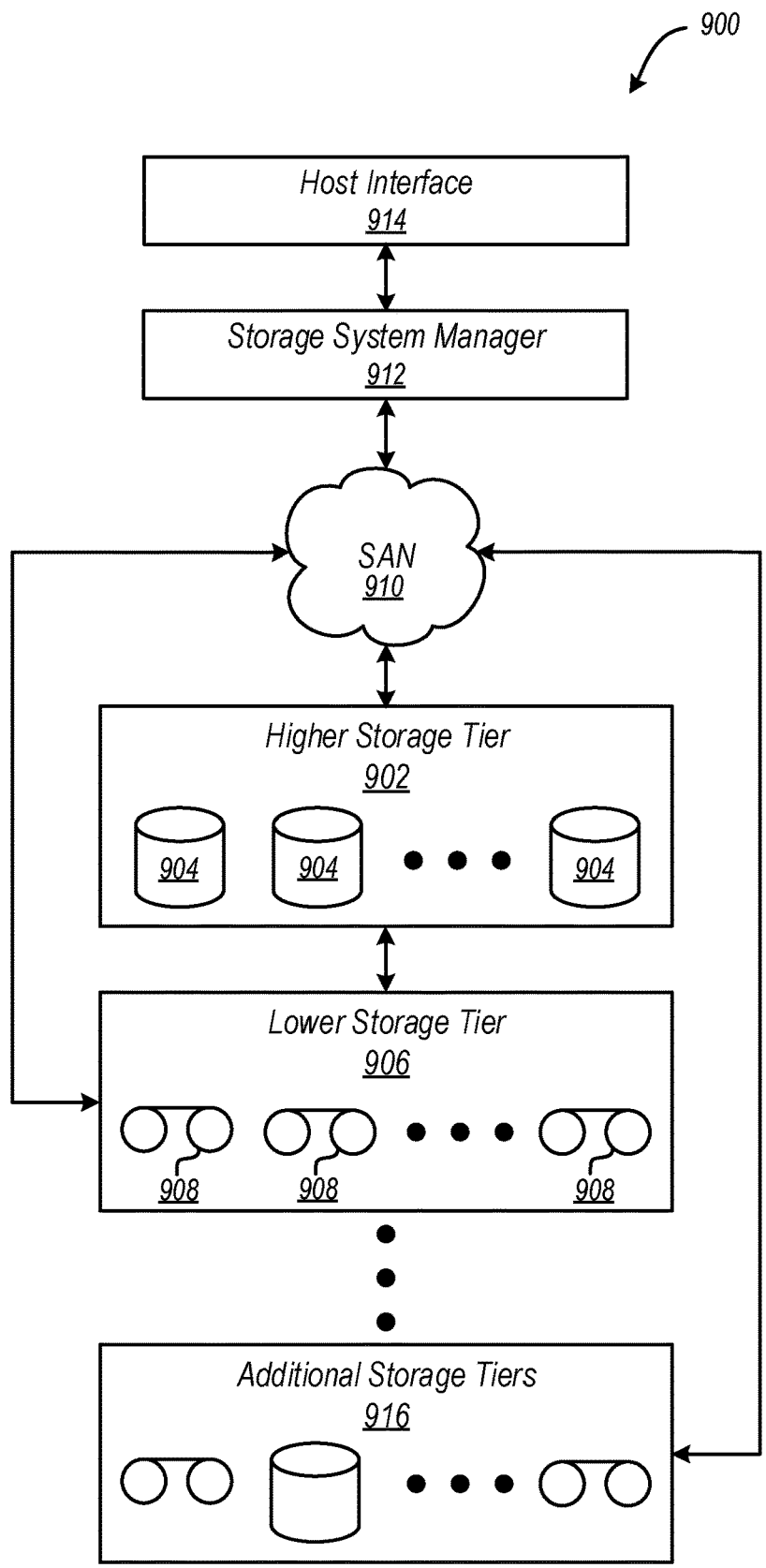
FIG. 9 is a depiction of a tiered data storage system in accordance with one approach.

Now referring to FIG. 9, a storage system 900 is shown according to one approach. Note that some of the elements shown in FIG. 9 may be implemented as hardware and/or software, according to various aspects. In some approaches, the storage system 900 may be implemented in an automated data storage library such as that shown in FIGS. 1-2. In other approaches, an automated data storage library such as that shown in FIGS. 1-2 may be a tier of the storage system 900.

The storage system 900 may include a storage system manager 912 for communicating with a plurality of media on at least one higher storage tier 902 and at least one lower storage tier 906. The higher storage tier(s) 902 preferably may include one or more random access and/or direct access media 904, such as hard disks in hard disk drives (HDDs), nonvolatile memory (NVM), solid state memory in solid state drives (SSDs), flash memory, SSD arrays, flash memory arrays, etc., and/or others noted herein or known in the art. The lower storage tier(s) 906 may preferably include one or more lower performing storage media 908, including sequential access media such as magnetic tape in tape drives and/or optical media, slower accessing HDDs, slower accessing SSDs, etc., and/or others noted herein or known in the art. One or more additional storage tiers 916 may include any combination of storage memory media as desired by a designer of the system 900. Also, any of the higher storage tiers 902 and/or the lower storage tiers 906 may include some combination of storage devices and/or storage media.

The storage system manager 912 may communicate with the storage media 904, 908 on the higher storage tier(s) 902 and lower storage tier(s) 906 through a network 910, such as a storage area network (SAN), as shown in FIG. 9, or some other suitable network type. The storage system manager 912 may also communicate with one or more host systems (not shown) through a host interface 914, which may or may not be a part of the storage system manager 912. The storage system manager 912 and/or any other component of the storage system 900 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more approaches, the storage system 900 may include any number of data storage tiers, and may include the same or different storage memory media within each storage tier. For example, each data storage tier may include the same type of storage memory media, such as HDDs, SSDs, sequential access media (tape in tape drives, optical disc in optical disc drives, etc.), direct access media (CD-ROM, DVD-ROM, etc.), or any combination of media storage types. In one such configuration, a higher storage tier 902, may include a majority of SSD storage media for storing data in a higher performing storage environment, and remaining storage tiers, including lower storage tier 906 and additional storage tiers 916 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 902, while data not having one of these attributes may be stored to the additional storage tiers 916, including lower storage tier 906. Of course, one of skill in the art, upon reading the present descriptions, may devise many other combinations of storage media types to implement into different storage schemes, according to the approaches presented herein.

According to some approaches, the storage system (such as 900) may include logic configured to receive a request to open a data set, logic configured to determine if the requested data set is stored to a lower storage tier 906 of a tiered data storage system 900 in multiple associated portions, logic configured to move each associated portion of the requested data set to a higher storage tier 902 of the tiered data storage system 900, and logic configured to assemble the requested data set on the higher storage tier 902 of the tiered data storage system 900 from the associated portions. Of course, this logic may be implemented as a method on any device and/or system or as a computer program product, according to various aspects.

Cooling data centers is a very important and complex balance of cost/energy efficiency and preserving the integrity/reliability of data storage equipment. Problems occur when a library door is opened for operator and/or service access. When a library door is opened, unsafe, outside air may enter the enclosure. Data storage media and/or data storage equipment may be damaged if the ambient temperature and/or the relative humidity of the air entering the enclosure is outside the safe and/or functional operating limits of the data storage media and/or data storage equipment.

In order to place some of the inventive concepts disclosed herein in context, much of the description refers to tape equipment and tape drives. This has been done by way of example only, and the concepts disclosed in the various exemplary approaches may be readily applied to any type of data storage media, associated equipment and/or storage thereof. Furthermore, a tape drive may include any type of tape drive known in the art. The inventive concepts disclosed herein may be adaptable to future tape-related products without straying from the scope and spirit of the present invention.

In a self-cooling library, when the ambient temperature and/or relative humidity of the data center becomes warm and moist (e.g. at a temperature of 35 degrees Celsius and 80% relative humidity), the tape drives inside the library may have an internal temperature of approximately 25 degrees Celsius. This internal temperature is below the dew point temperature of the outside air. If the internal temperature is below the dew point temperature of the outside air, in response to opening the front door of the library, the outside air may enter the tape drive and water vapor may condense on the tape drive read/write head element and/or other sensitive elements. Condensation may result in permanent damage, e.g., corrosion, to the tape drive read/write head element and/or other sensitive elements.

The tape drives in a self-cooling library are housed in tape drive canister assemblies that include cooling fans that draw air from the front of the tape drive canister and exhaust air out of the back of the tape drive canister. The front of the tape drive canister typically faces the door of the library enclosure so that the tape drive canister cooling fans actively pull the warm and moist air through the tape drive. This active pulling of warm and moist air through the tape drive increases the probability that condensation occurs in the tape drive.

Another problem that may arise in a self-cooling library involves inadequate internal air mixing. Inadequate internal air mixing may create warm and cold regions in the library. The warm and cold regions in the library may result in tape drives maintained at varying operating temperatures. Different operating temperatures in the library may result in undesirable variations in the long-term reliability of the tape drives and may reduce the probability that all tapes may be read on all drives.

A prior attempt to address condensation and air mixing issues includes implementing an indicator on the front of the library that lights when the tape drive internal temperature and relative humidity are such that condensation is possible. The indicator light warns that the door should not be opened at that time.

A drawback to this attempted approach is that the inside of the library cannot be accessed when the indicator light is on and, therefore, any operator and/or service action is delayed until the environmental conditions in the library change sufficiently to turn off the indicator light. This delay may be hours or days.

Further attempts to address condensation and/or air mixing issues include putting tape drive canisters into a "self-protect mode." In a self-protect mode, the cooling fans in the tape drive canister are turned off to prevent condensation by keeping warm and moist air from entering the tape drives. The tape drive internal temperature rises when cooling fans in the tape drive canister are turned off. The increase in the tape drive internal temperature decreases the probability that the sensitive head component is below the dew point temperature so that condensation is less likely not occur. However, the tape drive internal electronics eventually reach the maximum operating temperature when the tape drive canister's cooling fans are turned off. In response to reaching the tape drive internal electronics' maximum operating temperature, the tape drive canister's cooling fans turn on for a sufficient time to cool down the internal electronics. The tape drive canister's cooling fans draw the moist, ambient air into the tape drive, but the head component is warmed to above the dew point temperature. In response to the tape drive internal electronics cooling off, the tape drive canister's cooling fans turn off. The tape drive canisters in a self-protect mode continue this on-off cycling as long as the tape drive canisters are in self-protect mode.

A drawback to this attempted approach is that the self-protect mode may not sufficiently prevent condensation on the head element if the tape drive canister cooling fans are turned on before the internal temperatures have risen to above the dew point of the outside air.

Moreover, the swings in temperature are more likely to cause thermal degradation of the sensitive drive components. Additionally, repeatedly raising and lowering the temperatures in the self-protect mode may create stress on the components and/or solder joints of the tape drive internal electronics. Stress on the components and/or solder joints of the tape drive internal electronics may lower the long-term reliability of the tape drive.

Some of the inventive concepts herein illustrate an air curtain generator comprising fans which draw air from the back of the library frame. The fans exhaust the air along the front of the tape drive canister slots through a nozzle which has a downward-directed narrow opening. The downward-directed narrow opening may create a relatively high volume and high velocity exhaust airflow. The airflow through the downward-directed narrow opening may create a wide but thin "curtain" of air in a predefined trajectory between the accessor aisle and the tape drive canister slots.

The volume and velocity of the airflow is preferably sufficient to create an air curtain that prevents unwanted mixing of the relatively cooler, circulating air and potentially warmer, ambient air from the accessor aisle. The warm, ambient air is referred to herein interchangeably as "outside air." Air from the accessor aisle may also be referred to herein interchangeably as "outside air." As noted above, the ambient air may increase in temperature and/or humidity when the door of the library is opened thereby allowing air from outside the library to enter the accessor aisle.

The air curtain generator with the nozzle creates an air curtain having a velocity that is sufficient to create a barrier to outside air and/or minimize unwanted mixing of the outside air with air passing back through the tape drive canisters. The airflow through the nozzle creates a "barrier" such that the intermixing is less than 10% intermixing of outside air with the air in the air curtain that is drawn back into the tape drive canisters. The intermixing may be less than approximately 10%, 9%, 8%, 7%, 6%, 5%, 4%, 3%, 2%, or 1% intermixing of outside air with the air in the air curtain that is drawn back into the tape drive canisters. In another approach, the intermixing may be 0%.

A "full air curtain" may comprise an air curtain which protects all occupied drive slots in a storage library. The full air curtain may cross the entire front of the occupied slots in a storage library. The volume of air per unit time entering a full air curtain across the entire front of the occupied drive slots may be at least as great as a volume of air that the fans in the drives cumulatively draw per the same unit of time, and preferably greater.

The air curtain may be thin enough to be effective even if an accessor (as described above in reference to FIG. 2) is located in front of the drives being protected by the air curtain. Moreover, the protrusion of the downward-directed narrow opening of the nozzle may be limited by the effective operation path of the accessor and/or other components in the library as described above in regard to FIG. 2 and other Figures.

In an exemplary approach, the air curtain generator is an air curtain canister comprising a fan and a nozzle for directing the airflow exiting the housing in a predefined trajectory for creating an air curtain. The air curtain canister may comprise a housing having a form factor approximating an exterior of a data storage drive. The air curtain canister may be insertable into a drive slot of a data storage library.

An example of an insertable air curtain canister may comprise a housing having a form factor approximating an exterior of a tape drive canister which is insertable into a tape library. The air curtain canister may be installed above other tape drive canisters in the same column and frame. When the air curtain canister fans are running, the air curtain flows vertically down in front of the tape drive canisters below.

In one configuration, the nozzle may direct the air curtain vertically down and fan out to the sides in order to cover drive slots that are not directly below the air curtain canister. The nozzle may include additional fans and/or baffles which direct the air in a wider configuration than an airflow directed vertically straight downwards. In one approach, the air curtain canister may be located in the center of an array of tape drive canisters and is configured to direct the air curtain airflow in front of tape drive canisters directly below or indirectly below the air curtain canister. In other approaches, the air curtain canister is not limited to a location above the tape drive canister(s) to be protected. For example, the air curtain canister may be located below the tape drive canister(s) to be protected and direct the air curtain vertically upwards. In another example, the air curtain canister may be located to the left and/or the right of the tape drive canister(s) to be protected and direct the air curtain horizontally across the tape drive canister(s) to be protected.

In another approach, the nozzle protruding from the air curtain canister is wider than a single tape drive slot and directs air in the air curtain vertically down in front of tape drive slots which are directly below the air curtain canister and tape drive slots which are indirectly below the air curtain canister. A nozzle of the air curtain canister which is wider than one tape drive canister may protect a horizontal array of tape drive canisters.

The air curtain canister may be positioned above one or more tape drive canisters to be protected. The air curtain canister may additionally be positioned above an array of tape drive canisters. There may be one or more air curtain canisters protecting one or more tape drive canisters.

The cooling air drawn into the tape drive canisters originates from the air curtain airflow rather than the air in the accessor aisle at the front of the library. The cooling air drawn into the tape drive canisters originates from the air curtain airflow rather than the air from outside the library even if the door is an open configuration.

In a preferred approach, the air curtain generator is not limited to an air curtain canister. The air curtain generator may be a separate venting component above the tape drive canister(s) to be protected such that air curtain generation does not limit or reduce the capacity of the storage frame. In other approaches, the air curtain generator is not limited to a location above the tape drive canister(s) to be protected. For example, the air curtain generator may be located below the tape drive canister(s) to be protected and direct the air curtain vertically upwards. In another example, the air curtain generator may be located to the left and/or the right of the tape drive canister(s) to be protected and direct the air curtain horizontally across the tape drive canister(s) to be protected.

Various inventive approaches as described herein may be implemented any type of tape library, such as in the IBM TS4500 Tape Library and any associated canister packages. (International Business Machines (IBM), 1 New Orchard Road, Armonk, N.Y. 10504-1722, United States). Of course, the inventive aspects may be implemented in any data storage library as would be understood by one having ordinary skill in the art.

Figure 10:
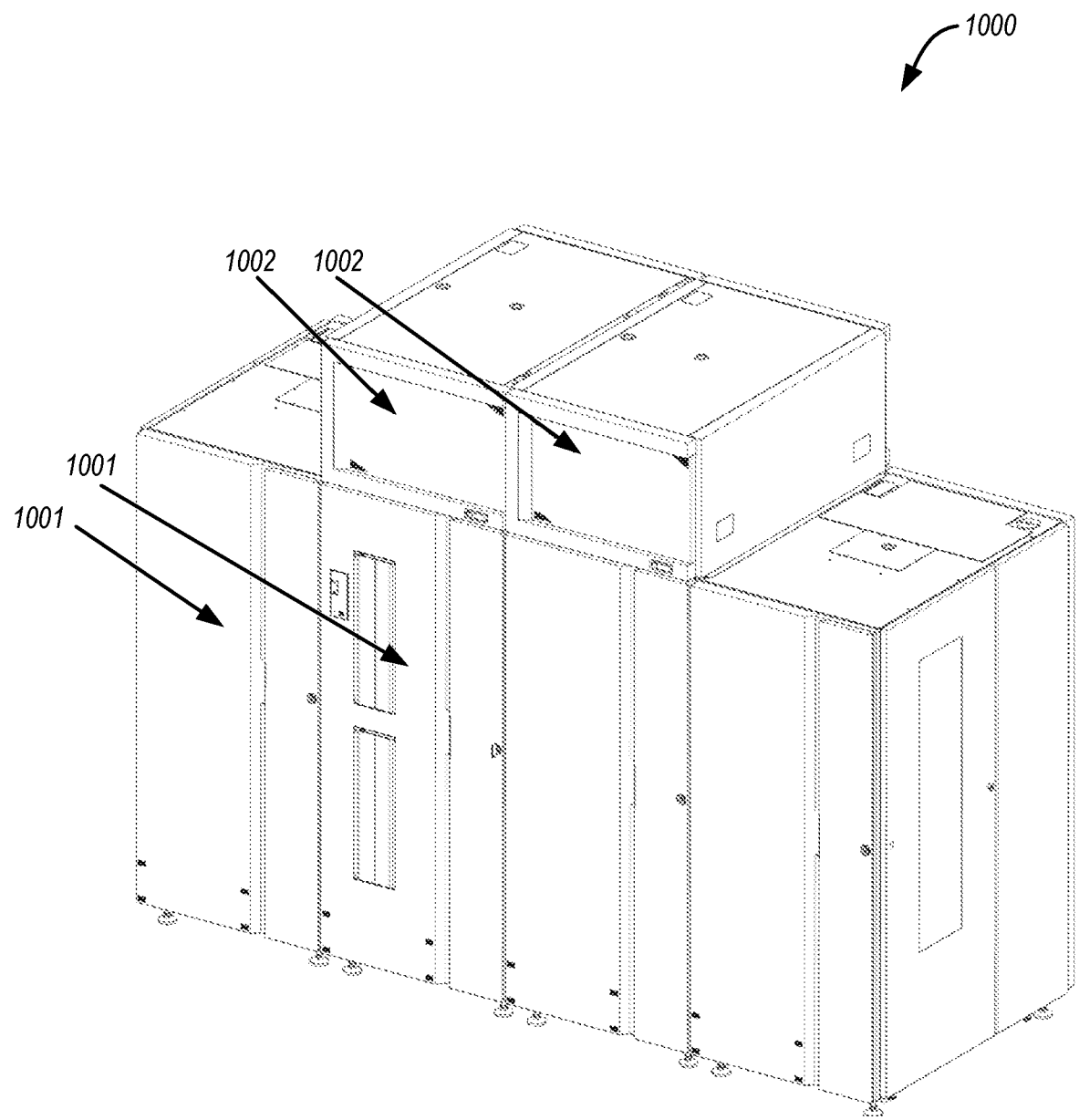
FIG. 10 is a perspective view of a data storage library with an integrated cooling system according to one approach.

FIG. 10 illustrates a data storage library 1000 which stores and retrieves data storage cartridges, containing data storage media, from multi-cartridge deep slot cells and single cartridge storage slots. As an option, the present data storage library 1000 may be implemented in conjunction with features from any other approach listed herein, such as those described with reference to the other FIGS. For example, FIGS. 15-20 depict various configurations of the automated tape library of FIG. 10. Of course, however, such a data storage library 1000 and others presented herein may be used in various applications and/or in permutations which may or may not be specifically described in the illustrative configurations listed herein. Further, the data storage library 1000 presented herein may be used in any desired environment. Moreover, it should be noted that references to "data storage media" herein refer to data storage cartridges, and for purposes of the present application, the two terms may be used synonymously.

The data storage library 1000 of FIG. 10 comprises one or more storage frames 1001. One or more of the storage frames 1001 may be coupled to one or more air conditioning units 1002. A frame may comprise an expansion component of the library. Thus, storage frames may be added or removed to expand or reduce the size and/or functionality of the library. According to different approaches, frames may include additional storage slots, deep slot cells, drives, import/export stations, accessors, operator panels, etc.

The air conditioning units 1002 may be a CRAC unit, a central air conditioning unit, a ductless mini-split air conditioning unit, a hybrid air conditioner, a heating, ventilation, and air conditioning (HVAC) system, etc. The air conditioning units 1002 may be of any type known in the art.

An example of an automated data storage library which has a similar configuration as that depicted in FIG. 10 and may be implemented with some of the various aspects herein is the IBM TS4500 Tape Library.

Figures 11A, 11B:
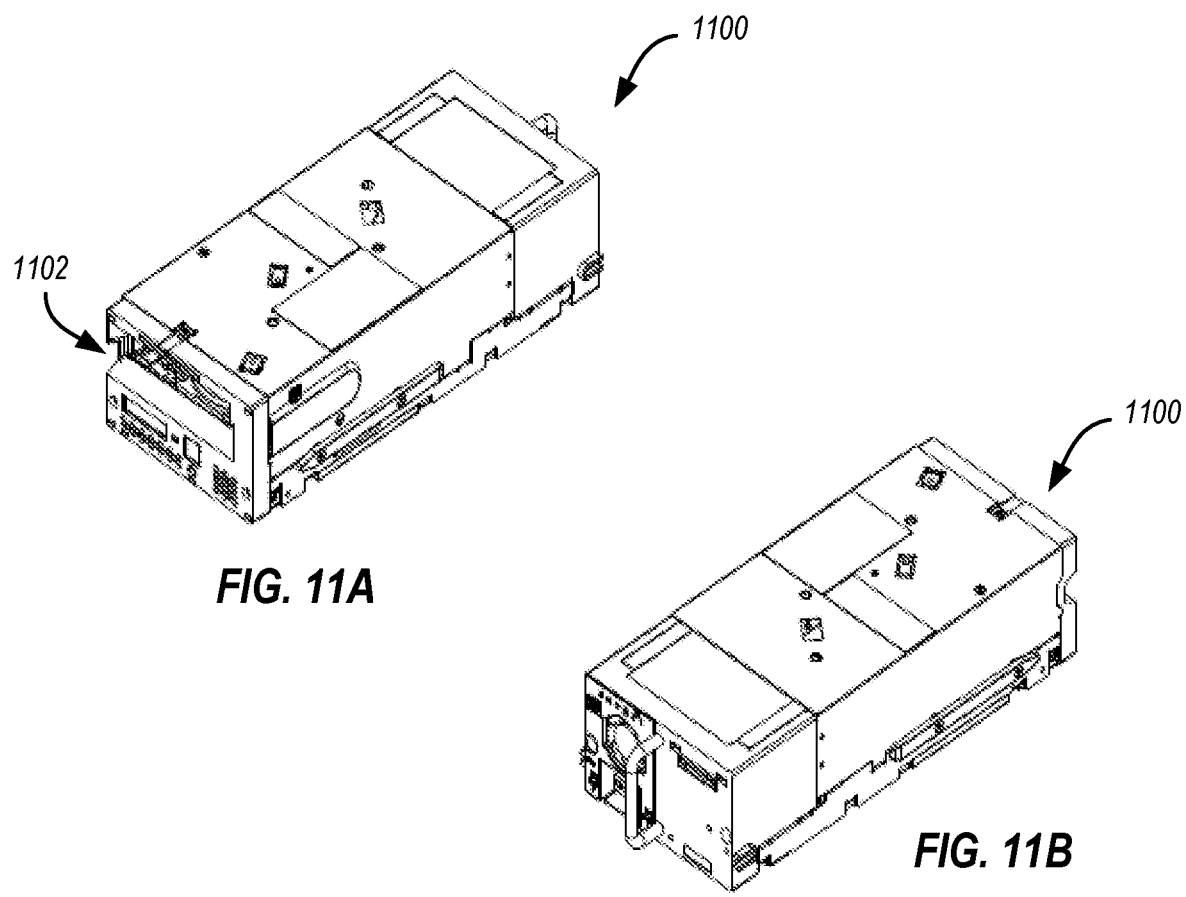
FIG. 11A is a front perspective view of a tape drive canister according to one approach.
FIG. 11B is a rear perspective view of the tape drive canister of FIG. 11A according to one approach.

FIGS. 11A-11B illustrate the front perspective view and rear perspective view of a tape drive canister 1100, according to one approach.

As an option, the present tape drive canister 1100 may be implemented in conjunction with features from any other approach listed herein, such as those described with reference to the other FIGS. Of course, however, such tape drive canister 1100 and others presented herein may be used in various applications and/or in permutations which may or may not be specifically described in the illustrative configurations listed herein. Further, the tape drive canister 1100 presented herein may be used in any desired environment.

As discussed above, a tape drive canister is used to read and/or write data with respect to the data storage media and may additionally communicate with a memory which is separate from the media and is located in the cartridge. According to one approach, a cartridge may be placed into the opening 1102 of the tape drive canister 1100. See also opening 503 of data storage drive 15 at (FIG. 5A).

Figure 12A:
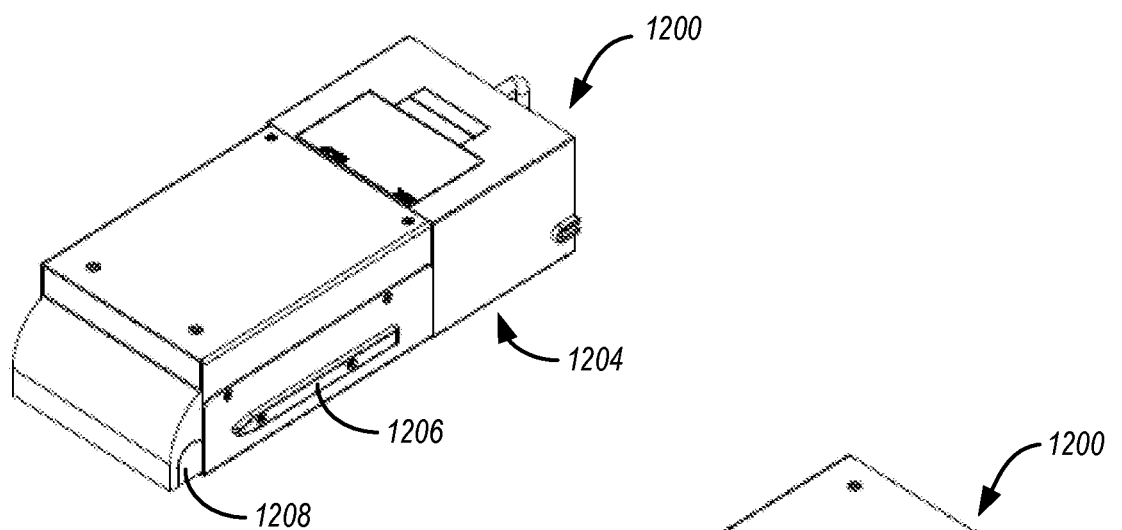
FIG. 12A is a front perspective view of an air curtain canister according to one approach.
Figure 12B:
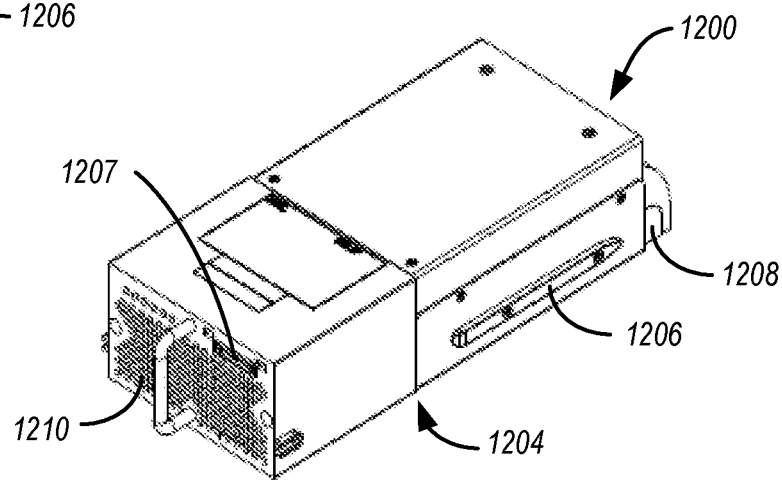
FIG. 12B is a rear perspective view of the air curtain canister of FIG. 12A according to one approach.

FIGS. 12A-12B illustrate the front perspective view and rear perspective view of an air curtain canister 1200, respectively, according to one approach. As an option, the present air curtain canister 1200 may be implemented in conjunction with features from any other approach listed herein, such as those described with reference to the other FIGS. Of course, however, such air curtain canister 1200 and others presented herein may be used in various applications and/or in permutations which may or may not be specifically described in the illustrative configurations listed herein. Further the air curtain canister 1200 presented herein may be used in any desired environment.

As shown in FIG. 12A-12B, the air curtain canister 1200 comprises a housing 1204, guide features 1206, an electronic docking feature 1207, a nozzle 1208, and a rear cover 1210 with air inlets to allow air to enter the canister from the back of a frame of a data storage library.

In an exemplary approach, the air curtain canister comprises a housing 1204 having a form factor approximating an exterior of a data storage drive. The housing 1204 having a form factor approximating an exterior of a data storage drive may be insertable into a drive slot of a data storage library. An example of such a data storage drive and data storage library includes a tape drive, e.g., the tape drive canister 1100 of FIG. 11A and a tape storage library. The tape drive may be any known tape drive usable with any tape storage library. The inventive concepts disclosed herein may be adaptable to future tape-related products without straying from the scope and spirit of the present invention.

The air curtain canister may comprise a nozzle 1208 for directing the airflow exiting the housing 1204 in a predefined trajectory for creating an air curtain. In one approach, the nozzle 1208 is located at the front of the air curtain canister and comprises a downward-directed narrow opening. The downward-directed narrow opening may allow a relatively high volume and velocity airflow to exhaust from the air curtain canister such that the airflow creates a wide but thin "curtain" of air.

In one configuration, the nozzle 1208 may be controllable such that the direction of the airflow may be modified. For example, the angle and/or shape of the downward-directed narrow opening may be adjustable to create a wider and/or narrower air curtain. The nozzle may comprise one or more individually controllable baffles for directing the air curtain. In one approach, the nozzle comprises venting air diverters for adjusting the angle of the airflow in order to change the direction of the air curtain and/or to create a wider and/or narrower air curtain.

In another approach, the air curtain canister includes one or more fans (described further in detail below in FIG. 13) internally, within the air curtain canister for creating an airflow in the housing 1204, e.g., in a continuous mode, in response to detecting a trigger condition, etc.

In one approach, the fans may be individually controllable such that one or more of the fans may be turned off and on, the speed of the fans may be adjusted, a second fan may start only when a trigger condition occurs as a boosting effect, one or more of the fans are capable of reversing directions, etc.

In one configuration, the air curtain canister comprises a cold air inlet (not shown) for receiving relatively cooler air for mixing with air in the airflow. The air curtain canister may comprise one or more cold air inlets. The cold air inlets may receive relatively cooler air for mixing with air in the airflow from one or more sources of relatively cooler air. Cold air may be used interchangeably herein to refer to "relatively cooler air."

In one configuration, the cold air inlet receives relatively cooler air for mixing with air in the airflow from one or more air conditioning units which are positioned above the air curtain canisters. The air conditioning unit may be of any type known in the art. The air conditioning unit may be a CRAC unit, a central air conditioning unit, a ductless mini-split air conditioning unit, a hybrid air conditioner, a HVAC system, etc.

In another approach, the air curtain canister may include a valve for selectively controlling an amount of relatively cooler air mixed with the air in the airflow created by the fan. The valve may be a globe valve, a gate valve, a ball valve, a butterfly valve, a plug valve, a check valve, a diaphragm valve, a needle valve, a pinch valve, or any other valve known in the art. In one approach, the air curtain canister may comprise any combination of valves and/or fans for selectively controlling an amount of relatively cooler air mixed with the air in the airflow.

In yet another approach, the air curtain canister comprises an internal mixing chamber (described further in detail below in FIG. 13) for mixing the relatively cooler air with the air in the airflow prior to exhausting the mixed air as the air curtain. The mixing chamber may comprise temperature and/or humidity sensors for determining whether the air is at the proper temperature and/or humidity level to be exhausted as the air curtain. If the air is not, then adjustments can be made such as manipulating the aforementioned valve, fan speed, etc.

In another approach, the air curtain canister does not comprise an internal mixing chamber. The mixing of the relatively cooler air with air in the airflow may occur as the air is moved by the fans.

In an exemplary approach, the guide features 1206 comprise appropriate external mechanical features so as to fit a single air curtain canister into a single drive slot of the tape library storage frames. The guide features 1206 may comprise appropriate dimensions so as to fit a single air curtain canister into a single drive slot of the tape library storage frames. The guide features may include a slide and lock system, a slide-rail assembly, magnetic catches, friction catches, ball bearing slides, or any other locking and/or mounting mechanisms known in the art.

An air curtain canister may comprise appropriate external electrical features so as to fit a single air curtain canister into a single drive slot of the tape library storage frames. In one approach, the air curtain canister may comprise an electronic docking feature 1207 which may be electronically configured to receive commands, alerts, sensor readings, etc. as a tape drive canister inserted into a drive slot may be capable of, as known in the art. The electronic docking feature 1207 may be electronically configured to receive commands, alerts, sensor readings, etc. regarding the operation of the air curtain canister such as commands and/or alerts to selectively control the fans and/or valves, adjust the angle of the nozzle (e.g. the angle of the airflow in the air curtain), etc.

According to one approach, an air curtain canister may be placed in the data storage drive at opening 15 (FIG. 2).

In a further approach, the air curtain canister may comprise one or more of any sensors known in the art. In one approach, the one or more sensors may be temperature sensors, humidity sensors, mass airflow sensors, pressure sensors, etc. to monitor the state of the air as would be understood by one having ordinary skill in the art.

A temperature sensor may be a negative temperature coefficient (NTC) thermistor, a resistance temperature detector (RTD), a thermocouple, a semiconductor-based sensor, an infrared sensor, a bimetallic device, a thermometer, a change-of-state sensor, etc. The temperature sensor may be any temperature sensor known in the art.

A humidity sensor may be a capacitive sensor, a resistive sensor, a thermally conductive sensor, etc. The humidity sensor may be any humidity sensor known in the art.

In one configuration, the air curtain canister may comprise a heater for heating air in the airflow. The heater may comprise one or more nichrome wire coils, ionic heating elements, tourmaline heating elements, ceramic heating elements, porcelain heating elements, infrared heating elements, titanium heating elements, or any other heating elements known in the art. The heater(s) may be used to heat air in the airflow in order to heat sensitive components of the tape drive canister to above the dew point of the outside air to prevent condensation.

In one approach, the velocity of the air in the airflow created by the fan in the air curtain canister is sufficient to create a barrier to outside air. The fan and nozzle for directing the airflow create a velocity of airflow in the air curtain such that the intermixing is less than 10% intermixing of outside air with the air drawn into the tape drives behind the air curtain. The intermixing may be less than approximately 10%, 9%, 8%, 7%, 6%, 5%, 4%, 3%, 2%, or 1% intermixing of outside air with the air drawn into the tape drives. In another approach, the intermixing may be 0%.

The rear perspective view of the air curtain canister 1200 comprises a rear cover 1210 with air inlets to allow air to enter the canister from the back of the frame. The air inlets to allow air to enter the canister from the back of the frame may be the same and/or, in addition to, the cold air inlets as discussed above. In one approach, the air inlets may comprise one or more cold air inlets for mixing relatively cooler air with air in the airflow.

In one configuration, an air curtain canister configured primarily for continuous mode operation may have a different air inlet physical design than an air curtain canister configured primarily for recirculation mode operation. The continuous mode air curtain canister may include similar housing dimensions and features. The continuous mode air curtain canister may additionally include inlets to draw air from multiple sources of temperature and/or humidity controlled air.

In one approach of a continuous mode air curtain canister as described above, the additional cold air inlets may be directed upward. Additional cold air inlets may be located near the opening where relatively cooler air from the integrated cooling air conditioner directs relatively cooler air into the accessor aisle. The cold air inlet allows relatively cooler air to enter the air curtain canister and flow through an internal chamber (e.g. the mixing chamber). The relatively cooler air may then be mixed with the warmer, recycled air being drawn into the rear of the air curtain canister by the fan. The mixed intermediate temperature air may then be pushed by the fan into the air curtain vertically downward toward the tape drive canisters below the air curtain canister.

Figure 13:
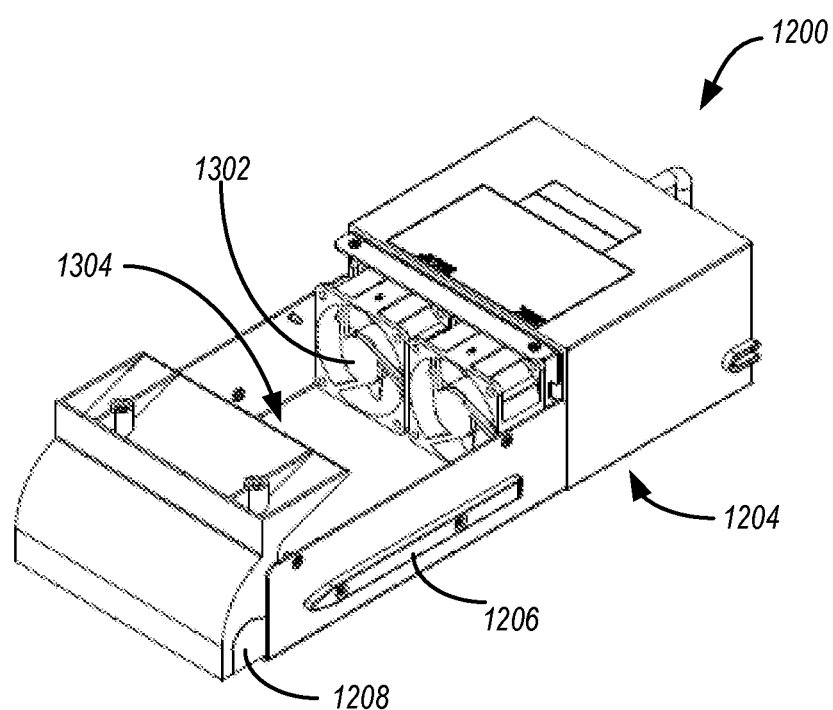
FIG. 13 is a perspective view of the air curtain canister of FIG. 12A with a cover removed, according to one approach.

Furthermore, FIG. 13 illustrates a perspective view of the air curtain canister 1200 of FIGS. 12A-12B with a cover removed. As shown, the air curtain canister 1200 comprises a fan 1302 and a mixing chamber 1304.

In one approach, the fan 1302 may comprise one or more fans. The fan 1302 may comprise one or more blade fans, centrifugal blowers, positive displacement blowers, squirrel cage blowers, other blowers, or any other type of apparatus for creating a current of air known in the art.

In one configuration, at least two fans are mounted side by side to increase the volume of airflow. Fans which are mounted side by side may draw air from the rear of the canister and push the air toward the front of the housing. In a preferred approach, the fan 1302 may be two, 60 mm×60 mm square fans.

In one approach, the fans may be individually controllable such that one or more of the fans may be turned off and on, the speed of the fans may be adjusted, a second fan may start only when a trigger condition occurs as a boosting effect, one or more of the fans are capable of reversing directions, etc.

In one configuration, one or more fans may be individually controllable such that one or more fans may be turned off until the fan(s) are instructed to turn on. In another approach, the one or more fans may be individually controllable such that one or more of the fans may be turned on until one or more of the fans are instructed to turn off.

In yet another approach, a second fan may be turned off and, in response to a trigger condition, turned on to create a boosting effect. A boosting effect may increase the mixing of relatively cooler air with air in the airflow. A boosting effect may include turning on a second fan to increase the velocity of the airflow in the air curtain and/or throughout the housing.

In another approach, reversing the direction of the one or more fans may reverse the direction of the airflow. The fans may reverse the direction of the airflow in order to adjust the intermixing between the outside air and the air in the air curtain that is drawn into the tape drive canisters. The direction of the fan may be reversed in response to a trigger condition.

As mentioned several times above, various actions such as starting one or more fans, adjusting a valve, etc. may occur upon detecting a trigger condition. A trigger condition may include detecting opening of a front door of the data storage library, receiving a command to run the fan from a user, occurrence of a specific time based on a predetermined schedule, sensing the temperature is too high based on a predefined operating temperature threshold, sensing the temperature is too low based on a predefined operating temperature threshold, sensing the humidity is too high based on a predefined operating humidity threshold, and sensing the humidity is too low based on a predefined operating humidity thresholds, etc. The predefined operating temperature threshold may be a temperature of the outside air at or above which condensation could occur if the outside air is drawn into the tape drives. The predefined operating temperature threshold may be above optimal temperatures for tape drive operation. The predefined operating humidity threshold may be a humidity level of the outside air at or above which condensation could occur if the outside air is drawn into the tape drives. The predefined operating humidity threshold may be above optimal humidity levels for tape drive operation.

In one configuration, the air curtain canister may comprise a mixing chamber 1304 for mixing the relatively cooler air with the air in the airflow. The mixing chamber may comprise temperature and/or humidity sensors for determining whether the mixture of the relatively cooler air and the air in the airflow has the desired characteristics for the air curtain. Determining whether the mixed air has the desired characteristics for the air curtain may include a determination that air in the mixing chamber has reached a predetermined temperature, a range of predetermined temperatures, a predetermined humidity level, a range of predetermined humidity levels, etc. In a preferred approach, the determination is based on a combination of the foregoing factors.

In another approach, the interior of the air curtain canister may comprise a heater for heating air moved by the fan 1302 in the airflow. The heater may comprise one or more nichrome wire coils, ionic heating elements, tourmaline heating elements, ceramic heating elements, porcelain heating elements, infrared heating elements, titanium heating elements, or any other heating elements known in the art. The heater(s) may be used to heat air in the airflow in order to heat sensitive components of the tape drive canister above the dew point of the outside air to prevent condensation. The heater(s) may be positioned in the mixing chamber, near the air inlet, and/or near or in the nozzle.

Figure 14A:
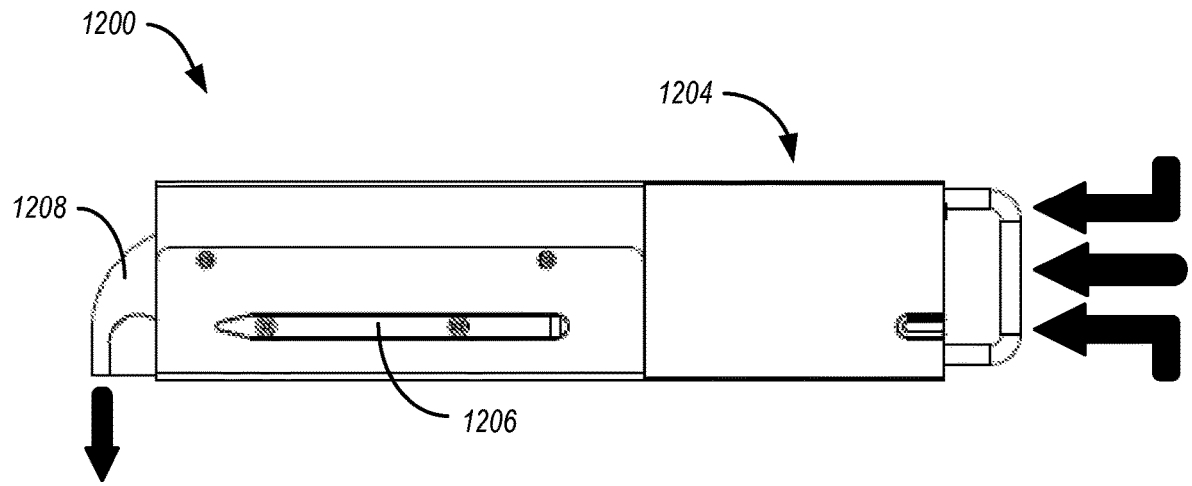
FIG. 14A is a side view of an air curtain canister according to one approach.
Figure 14B:
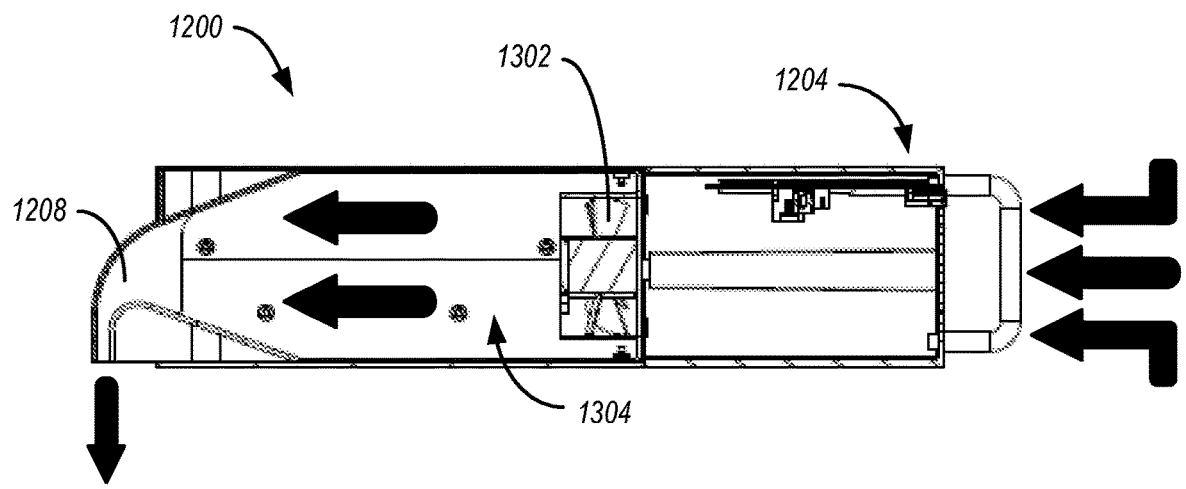
FIG. 14B is a cross-sectional view of the air curtain canister of FIG. 14A, according to one approach.

FIGS. 14A-14B illustrate an exemplary airflow through the air curtain canister 1200.

In one approach, the airflow is directed by the fan 1302. The fan 1302 draws air from the rear of the air curtain canister. The fan 1302 pushes the air through the mixing chamber 1304 of the air curtain canister where the air may be selectively mixed with relatively cooler air as discussed above. Note that the mixing chamber may also and/or alternatively be located upstream of the fan 1302, rather than downstream as shown. The mixed air is exhausted through the nozzle 1208 into the airflow which comprises the air curtain at the front of the air curtain canister.

Figure 15:
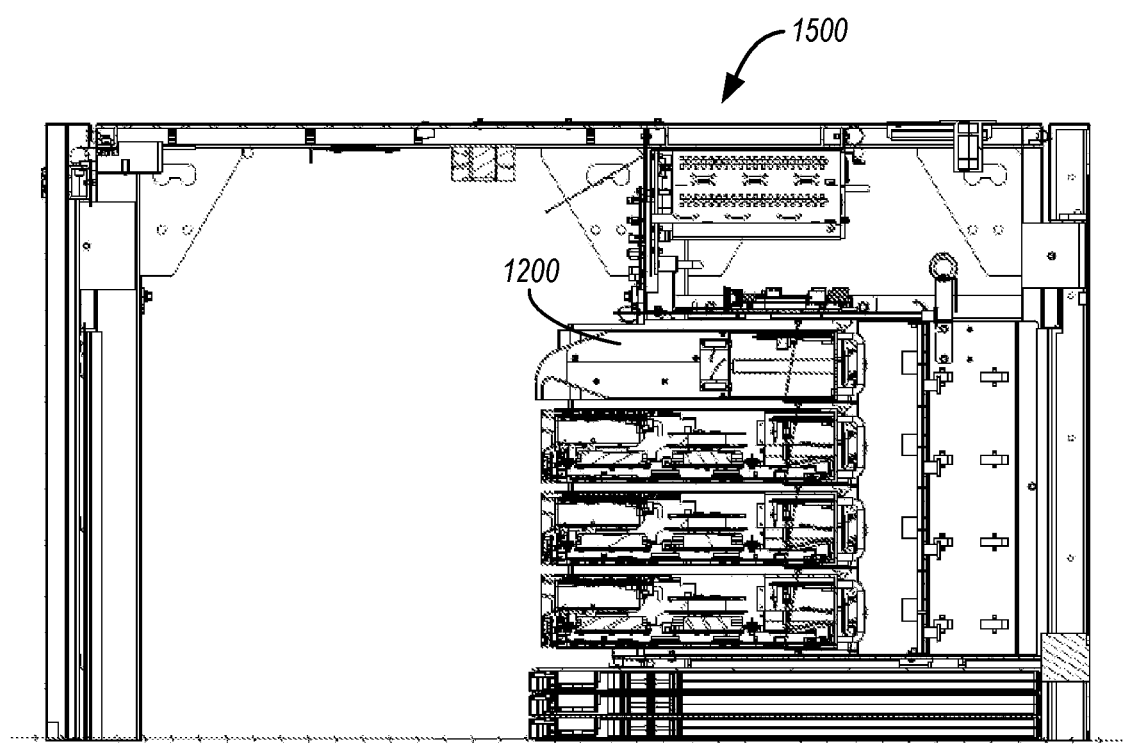
FIG. 15 is a partial cross-sectional side view of a storage frame of the data storage library of FIG. 10 according to one approach.

FIG. 15 is a partial cross-sectional side view of a storage frame 1500 of the data storage library 1000 of FIG. 10 according to one approach. As an option, the storage frame 1500 may be implemented in conjunction with features from any other approach listed herein, such as those described with reference to the other FIGS. Of course, however, such a storage frame 1500 and others presented herein may be used in various applications and/or in permutations which may or may not be specifically described in the illustrative configurations listed herein. Further, the storage frame 1500 presented herein may be used in any desired environment.

FIG. 15 illustrates a configuration of a storage frame in a data storage library which may comprise an array of drive slots each configured to receive a data storage drive therein, and a plurality of air curtain canisters 1200 positioned laterally in the array of drive slots for creating an air curtain across a front of the remaining drive slots in the array. Each air curtain canister may comprise a housing having a form factor approximating an exterior of a data storage drive, a fan for creating an airflow in the housing, and a nozzle for directing the airflow exiting the housing in a predefined trajectory for creating the air curtain. Exemplary air curtain canisters are described in reference to FIGS. 12A-14B above.

In addition to one or more air curtain canisters, the data storage library may comprise one or more fans which draw air from the rear of the array of drive slots, e.g., as generally described in reference to FIGS. 18-20, below. In one approach, the fan may comprise one or more blade fans, centrifugal blowers, positive displacement blowers, squirrel cage blowers, other blowers, or any other type of apparatus for creating a current of air known in the art.

In one approach, the fans may be individually controllable such that one or more of the fans may be turned off and on, the speed may be adjusted, a second fan may start only when a trigger condition occurs as a boosting effect, one or more of the fans are capable of reversing directions, etc.

The data storage library may include at least some of the air curtain canisters which comprise a cold air inlet for mixing relatively cooler air with air in the airflow which is drawn into the air curtain canister from the rear of the array of drive slots. The cold air inlets may receive relatively cooler air for mixing with air in the airflow from one or more sources of relatively cooler air.

In one configuration, the cold air inlet receives relatively cooler air for mixing with air in the airflow from one or more air conditioning units which are positioned above the air curtain canisters. The air conditioning unit may be of any type known in the art. The air conditioning unit may be a CRAC unit, a central air conditioning unit, a ductless mini-split air conditioning unit, a hybrid air conditioner, a HVAC system, etc.

The data storage library may comprise a robotic accessor configured to move data storage cartridges between storage slots and drives in the drive slots. In this approach, the air curtain position is between a travel path of the robotic accessor and the front of the array of the drive slots. The robotic accessor may be of the type as described above in FIGS. 1-8. In one approach, the air curtain is thin enough to be effective even if an accessor is located in front of the drives being protected by the air curtain.

In one configuration, the data storage library may comprise data storage drives in at least some of the drive slots. The air curtain canisters are positioned to create a full air curtain across the entire front of the occupied drive slots. The volume of air entering the full air curtain is at least as great as the volume of air the drives in the drive slots cumulatively draw. The volume of air entering the full air curtain may be measured per unit time and the volume of air the drives in the drive slots cumulatively draw may be measured per the same unit of time.

Figure 16:
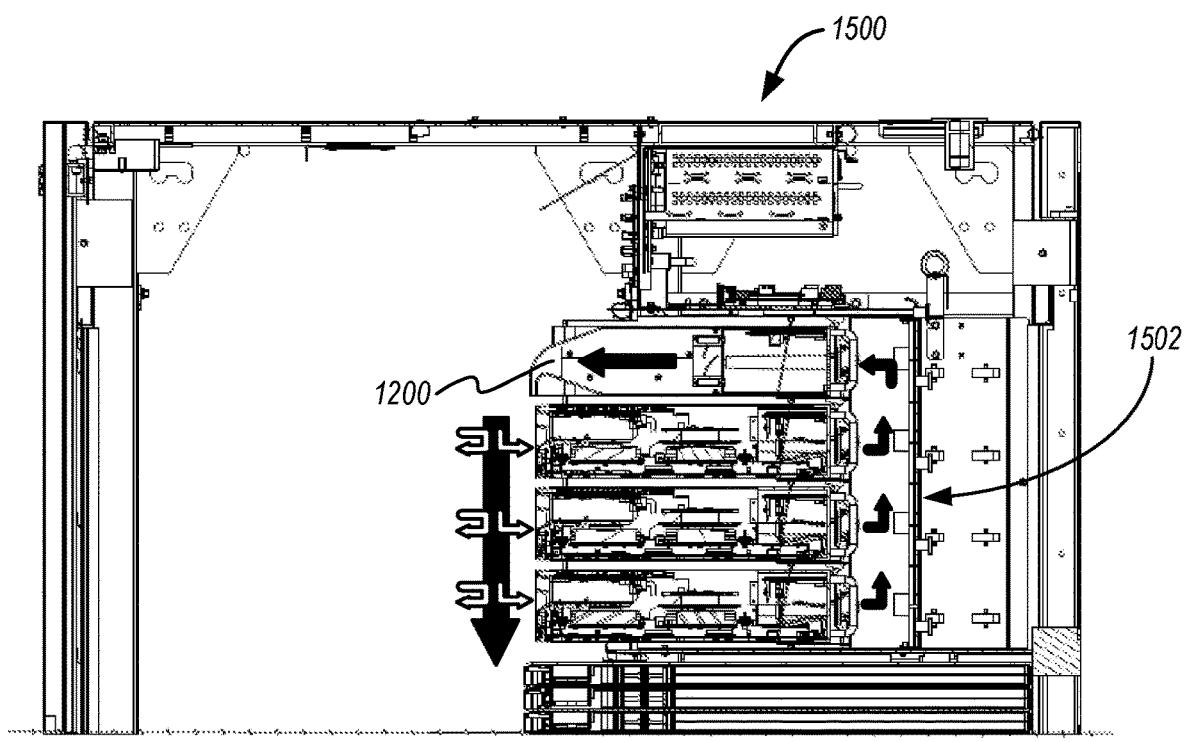
FIG. 16 is a partial cross-sectional side view of a storage frame of the data storage library of FIG. 10 according to one approach.

FIG. 16 illustrates a partial cross-sectional side view of a storage frame 1500 of the data storage library 1000 of FIG. 10 according to one approach. As an option, the storage frame 1500 may be implemented in conjunction with features from any other approach listed herein, such as those described with reference to the other FIGS. Of course, however, such a storage frame 1500 and others presented herein may be used in various applications and/or in permutations which may or may not be specifically described in the illustrative configurations listed herein. Further, the storage frame 1500 presented herein may be used in any desired environment.

FIG. 16 illustrates a configuration of a data storage library which may comprise an array of drive slots each configured to receive a data storage drive therein, and a plurality of air curtain canisters 1200 positioned laterally in the array of drive slots for creating an air curtain across a front of the remaining drive slots in the array. Each air curtain canister may comprise a housing having a form factor approximating an exterior of a data storage drive, a fan for creating an airflow in the housing, and a nozzle for directing the airflow exiting the housing in a predefined trajectory for creating the air curtain. Exemplary air curtain canisters are described in reference to FIGS. 12A-14B above.

FIG. 16 illustrates an exemplary airflow in a data storage library created by an air curtain canister 1200. Paneling, ducting, and/or any other known type of barrier may be present at the rear of the drives to direct the circulating air back to the air curtain canister 1200. In the example shown, a panel 1502 isolates the air exiting the drives from the remaining areas of the storage frame and directs it to the air curtain canister 1200.

The air curtain canister may operate in a recirculation mode and/or a continuous mode, according to various approaches. In a continuous mode, the air curtain canister fans operate continuously until the air curtain canister is instructed otherwise.

In a recirculation mode, the air curtain canister fans are turned on in response to a trigger condition. A trigger condition may include detecting opening of a front door of the data storage library, receiving a command to run the air curtain canisters from a user, occurrence of a specific time based on a predetermined schedule, sensing the temperature is too high based on a predefined operating temperature threshold, sensing the temperature is too low based on a predefined operating temperature threshold, sensing the humidity is too high based on a predefined operating humidity threshold, and sensing the humidity is too low based on a predefined operating humidity thresholds, etc. The predefined operating temperature threshold may be a temperature of the outside air at or above which condensation could occur if the outside air is drawn into the tape drives. The predefined operating temperature threshold may be above optimal temperatures for tape drive operation. The predefined operating humidity threshold may be a humidity level of the outside air at or above which condensation could occur if the outside air is drawn into the tape drives. The predefined operating humidity threshold may be above optimal humidity levels for tape drive operation.

In the recirculation mode, the tape drive canisters do not draw air from the accessor aisle and/or air from outside the library coming through an open library door. The tape drive canister cooling fans draw air supplied from the air curtain. The tape drive canisters exhaust air toward the back of the frame. The airflow in the air curtain may tend to form a recirculating loop through the tape drive canisters and back through the air curtain canister(s) above the tape drive canisters. The recirculating air tends to increase in temperature over time due to heat generated in the drive electronics in addition to the fan motion. The recirculating air is preferably selectively mixed with relatively cooler air in order to create air that is the proper temperature and/or humidity level to be exhausted as the air curtain. Because of the shape of the airflow in the air curtain, the airflow in the air curtain infrequently mixes with the warmer outside air. If a library door is in an open configuration, the warm, moist outside air is not substantially drawn into the tape drive canister even though the tape drive canister cooling fans continue to operate normally.

The front door of the library may be fully opened immediately after the air curtain canister fans turn on and the air curtain flows when the air curtain canisters are in the recirculation mode. The air curtain allows for faster access to the library because there is no need to wait for the internal temperature of the tape drive canisters to increase sufficiently before opening the library door.

Additionally, the tape drive canisters do not periodically draw in potentially hazardous outside air which otherwise occurs in absence of the air curtain when the tape drive canister cooling fans turn on to protect the drive internal electronics from overheating.

The tape drive internal electronics do not suffer from repeated thermal cycling in a recirculation mode, as they do in a conventional self-protect mode without an air curtain. Thermal cycling occurs when the tape drive internal electronics are operating to near-overheating conditions every few minutes whenever the tape drive canister cooling fans are turned from on to off and vice versa in a self-protect mode. Thermal cycling causes internal stress, e.g. corrosion, on the solder joints and/or other mechanical elements of the electronics. High operating temperatures reduce the life of the tape drive internal electronics. The recirculation mode prevents the occurrence of thermal cycling and improves the life and reliability of the tape drive internal electronics.

Figure 17:
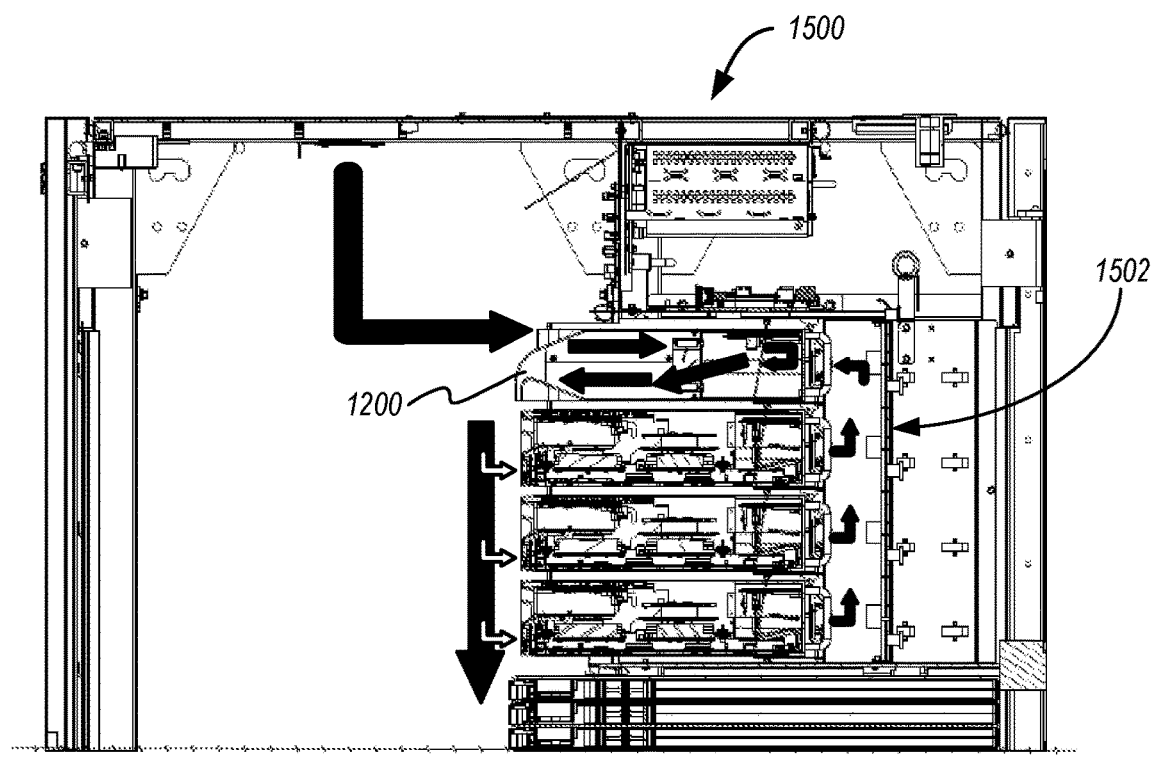
FIG. 17 is a partial cross-sectional side view of a storage frame of the data storage library of FIG. 10 according to one approach.

FIG. 17 illustrates a partial cross-sectional side view of a storage frame 1500 of the data storage library 1000 of FIG. 10 according to one approach. As an option, the present storage frame 1500 of the data storage library 1000 of FIG. 10 may be implemented in conjunction with features from any other approach listed herein, such as those described with reference to the other FIGS. Of course, however, such a storage frame 1500 and others presented herein may be used in various applications and/or in permutations which may or may not be specifically described in the illustrative configurations listed herein. Further, the storage frame 1500 presented herein may be used in any desired environment.

FIG. 17 illustrates a configuration of a data storage library which may comprise an array of drive slots each configured to receive a data storage drive therein, and a plurality of air curtain canisters 1200 positioned laterally in the array of drive slots for creating an air curtain across a front of the remaining drive slots in the array. Each air curtain canister may comprise a housing having a form factor approximating an exterior of a data storage drive, a fan for creating an airflow in the housing, and a nozzle for directing the airflow exiting the housing in a predefined trajectory for creating the air curtain. Exemplary air curtain canisters are described in reference to FIGS. 12A-14B above.

FIG. 17 further illustrates an exemplary airflow in a data storage library created by an air curtain canister coupled to a source of cooler air (not shown), e.g., providing cooler air from the top panel of the storage frame. Paneling, ducting, and/or any other type of barrier may be present at the rear of the drives to direct the circulating air back to the air curtain canister 1200. In the example shown, a panel 1502 isolates the air exiting the drives from the remaining areas of the storage frame and directs it to the air curtain canister 1200. Moreover, paneling, ducting, and/or any other known type of barrier may be present to direct the cooler air to the air curtain canister 1200. In the example shown, the cooler air enters through the top panel of the storage frame, as indicated by the bend arrow originating near the top panel of the storage frame.

The air curtain canister may operate in a recirculation mode and/or a continuous mode, according to various approaches. In a recirculation mode, the air curtain canister fans are turned on in response to a trigger condition, e.g., as described above with reference to FIG. 16.

In a continuous mode, the air curtain canister fans operate continuously until the air curtain canister is instructed otherwise. For example, in a continuous mode, the fan(s) in an air curtain canister remain turned on indefinitely, and in the approach shown in FIG. 17, the inlet(s) to the air curtain canister are controlled so that a relatively warmer air stream and a relatively cooler air stream are selectively mixed in the air curtain canister such that the air curtain airflow is a substantially constant and desired temperature and/or relative humidity. The air curtain canister may comprise one or more valves for selectively controlling an amount of relatively cooler air mixed with the air in the airflow which is drawn into the air curtain canisters from the rear of the array of drive slots. In a continuous mode, all of the tape drive canisters may have a substantially known and uniform inlet environmental condition so that variations in writing and reading conditions between tape drives in the same library are minimized.

In the exemplary continuous mode shown, relatively cooler air is selectively added to air being moved by at least some of the air curtain canisters for cooling the air based on at least one factor. Factors to be considered for determining whether to selectively add relatively cooler air include temperature sensor readings and/or humidity sensor readings. The temperature and/or the relative humidity of the inlet air to the drive canisters may be optimized so that data may be written and read to the tape media at substantially stable and optimal conditions.

In one configuration, an air curtain canister for continuous mode operation may have a different air inlet physical design than an air curtain canister for recirculation mode operation. The continuous mode air curtain canister may include similar housing dimensions and features. The continuous mode air curtain canister may include inlets to draw air from multiple sources of temperature and/or humidity controlled air. The inlets draw air from multiple sources of temperature and/or humidity controlled air in order to mix the air before exhausting the air through the nozzle at the front of the air curtain canister.

A continuous mode air curtain canister may comprise one or more additional cold air inlets at the front of the air curtain canister. The additional cold air inlets may be directed upward. The additional cold air inlets may be located near the opening where relatively cooler air from the integrated cooling air conditioner directs relatively cooler air into the accessor aisle. The cold air inlet allows relatively cooler air to enter the air curtain canister and flow through an internal mixing chamber (e.g. the mixing chamber).

In a preferred approach, each fan in the continuous mode air curtain canister may draw air from different plenums in the frame (e.g. one plenum being a relatively warmer air source and another plenum being a relatively cooler air source). The sensors in the air curtain canisters sense the temperature and/or relative humidity states of the inlet air and/or the mixed air. The air curtain canisters adjust the settings of the fan(s) and/or valve(s) according to the temperature and/or humidity states in order to control the temperature and/or relative humidity of the exhausted air of the air curtain.

In one example, the continuous mode operation air curtain canister may comprise at least two fans. The relatively cooler air is drawn into the canister by turning on one or more of the internal fans. The relatively cooler air may then be mixed with relatively warmer air being drawn into the rear of the air curtain canister by another internal fan. The mixed intermediate temperature air is exhausted through the nozzle into the air curtain airflow. The air curtain flows vertically downward toward the tape drive canisters below the air curtain canister.

In one approach, a method for controlling air curtain canisters, e.g., in the continuous mode and/or recirculation mode, is provided. The method may be performed in accordance with the present invention in any of the environments disclosed herein. Of course, more or less operations that those specifically described in herein may be included in the method, as would be understood by one of skill in the art upon reading the present description.

Each of the steps of the method may be performed by any suitable component of the operating environment. For example, in various aspects, the method may be partially or entirely performed by a computer, or some other device having one or more processors therein. The processor, e.g., processing circuit(s), chip(s), and/or module(s) implemented in hardware and/or software, and preferably having at least one hardware component may be utilized in any device to perform one or more steps of the method. Illustrative processors include, but are not limited to, a central processing unit (CPU), an application specific integrated circuit (ASIC), a field programmable gate array (FPGA), etc., combinations thereof, or any other suitable computing device known in the art.

The method includes selectively instructing air curtain canisters in a data storage library to create an air curtain across a front of an array of drive slots. Exemplary air curtain canisters are described in reference to FIGS. 12A-14B above.

Selectively instructing air curtain canisters in a data storage library may include instructing one or more air curtain canisters in the data storage library to turn on one or more fans in the air curtain canisters. Each air curtain canister may comprise one or more fans for creating an airflow. In one configuration, the fan may comprise one or more blade fans, centrifugal blowers, positive displacement blowers, squirrel cage blowers, other blowers, or any other type of apparatus for creating a current of air known in the art.

In one configuration, the fans may be individually controllable such that one or more of the fans may be turned off and on, the speed of the fans may be adjusted, a second fan may start only when a trigger condition occurs as a boosting effect, one or more of the fans are capable of reversing directions, etc.

In one approach, the air curtain canisters draw air from a rear of the array of drive slots. Air from the rear of the array of drive slots typically comprises air that has passed through the tape drive canisters which is warmed via the internal electronics, the movement of the fans, etc.

Another operation of the method comprises mixing relatively cooler air with air being moved through the air curtain canisters for cooling the air. One or more fans in the air curtain canisters may be used to selectively mix the relatively cooler air with air being moved through the air curtain. Again, the one or more fans may be individually controllable. Mixing relatively cooler air with air being moved through the air curtain canisters may include turning on a first fan, turning on a second fan, increasing the speed for one or more of the fans, instructing a cold air supply system to send relatively cooler air to the air curtain canisters, etc.

In one configuration, the air curtain canisters may each comprise a valve for selectively controlling an amount of the relatively cooler air mixed with the air in the airflow which is drawn into the air curtain canister from the rear of the array of drive slots. The valve may be a globe valve, a gate valve, a ball valve, a butterfly valve, a plug valve, a check valve, a diaphragm valve, a needle valve, a pinch valve, or any other valve known in the art. In one approach, the air curtain canister may comprise any combination of valves and/or fans for selectively controlling an amount of relatively cooler air mixed with the air in the airflow which is drawn into the air curtain canister from the rear of the array of drive slots.

In one approach, the method may include heating air being moved by the air curtain canisters. The air curtain canisters and/or the data storage library may comprise a heater for heating air in the airflow. The heater may comprise one or more nichrome wire coils, ionic heating elements, tourmaline heating elements, ceramic heating elements, porcelain heating elements, infrared heating elements, titanium heating elements, or any other heating elements known in the art. The heater(s) may be used to heat air in the airflow in order to heat sensitive components of the tape drive canister to above the dew point of the outside air to prevent condensation.

In one approach, the air curtain position is between a travel path of a robotic accessor and the front of the array of drive slots. The data storage library may comprise a robotic accessor configured to move data storage cartridges between storage slots and drives in the drive slots. The robotic accessor may be of the type as described above in FIGS. 1-8. In one approach, the air curtain is thin enough to be effective even if an accessor is located in front of the drives being protected by the air curtain.

In one approach, the air curtain across a front of an array of drive slots in the data storage library may comprise a volume of air entering the full air curtain which is at least as great as the volume of air the drives in the drive slots cumulatively draw. The volume of air entering the full air curtain may be measured per unit time and the volume of air the drives in the drive slots cumulatively draw may be measured per the same unit of time.

In one operation of the method, the air curtain canisters are instructed to run continuously when a continuous mode is active, where the air curtain canisters are only instructed to run in response to a trigger condition when a recirculating mode is active.

A trigger condition may include detecting opening of a front door of the data storage library, receiving a command to run the air curtain canisters from a user, occurrence of a specific time based on a predetermined schedule, sensing the temperature is too high based on a predefined operating temperature threshold, sensing the temperature is too low based on a predefined operating temperature threshold, sensing the humidity is too high based on a predefined operating humidity threshold, and sensing the humidity is too low based on a predefined operating humidity thresholds, etc., e.g., as described above.

In one approach of the method, the air curtain canisters are instructed to run continuously in a continuous mode, where relatively cooler air is selectively added to air being moved by at least some of the air curtain canisters for cooling the air based on at least one factor. Factors to be considered for determining whether to selectively add relatively cooler air include temperature sensor readings and/or humidity sensor readings.

Figure 18:
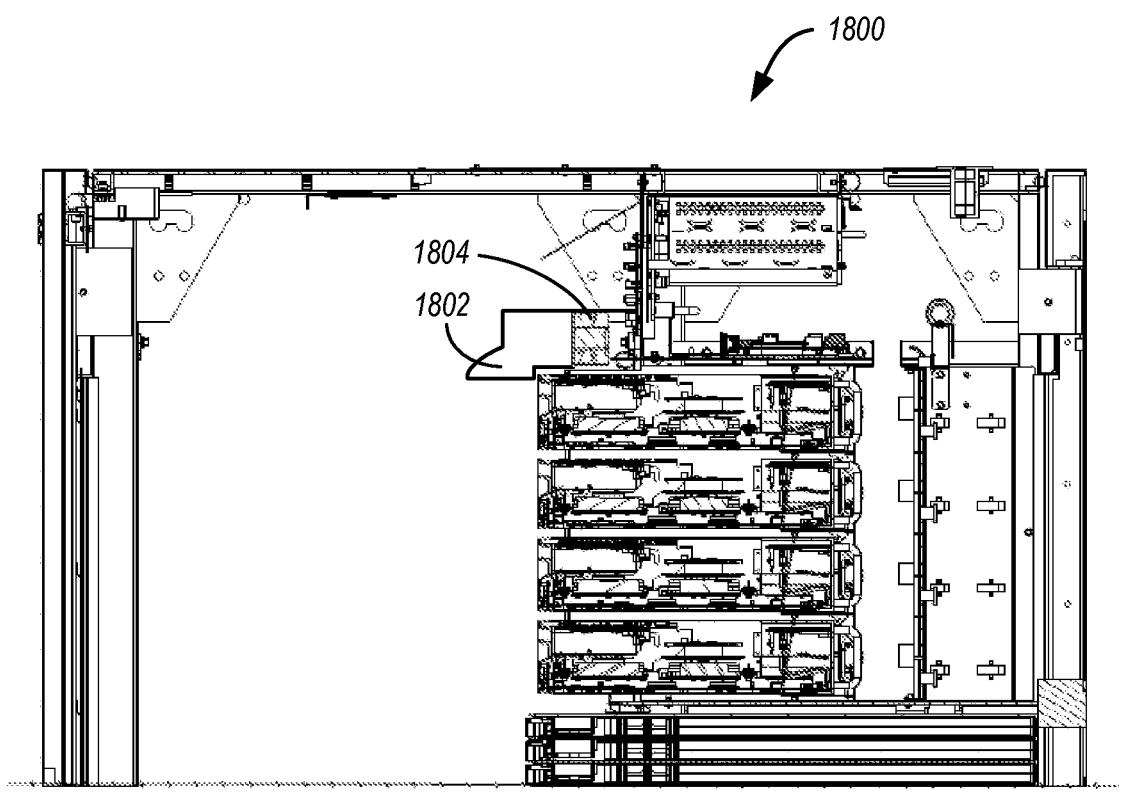
FIG. 18 is a partial cross-sectional side view of a storage frame of the data storage library of FIG. 10 according to one approach.

FIG. 18 is a partial cross-sectional side view of a storage frame 1800 of the data storage library 1000 of FIG. 10 according to one approach. As an option, the storage frame 1800 may be implemented in conjunction with features from any other approach listed herein, such as those described with reference to the other FIGS. Of course, however, such a storage frame 1800 and others presented herein may be used in various applications and/or in permutations which may or may not be specifically described in the illustrative configurations listed herein. Further, the storage frame 1800 presented herein may be used in any desired environment.

FIG. 18 illustrates a configuration of a data storage library which may comprise an array of drive slots each configured to receive a data storage drive therein, a nozzle 1802 for creating an air curtain across a front of the array of drive slots and a fan 1804 for creating an airflow through the nozzle.

In one configuration, the nozzle 1802 has a downward-directed narrow opening for directing airflow in a predefined trajectory for creating an air curtain. The downward-directed narrow opening may allow a relatively high volume and velocity airflow to exhaust from the air curtain such that the airflow creates a wide but thin "curtain" of air.

In one approach, the nozzle 1802 is positioned above the drive slots. The nozzle 1802 may be directed toward the front of the array of drive slots. The air curtain flows vertically down in front of the drive slots below. The protrusion of the downward-directed narrow opening of the nozzle may be limited by the effective operation of the robotic accessor and other components in the library as described above in regard to FIG. 2 and other Figures.

In one configuration, the nozzle 1802 has a width sufficient to create the air curtain across at least two horizontally-adjacent drive slots. In another approach, the nozzle includes a plurality of sub-nozzles, each sub-nozzle creating a portion of the air curtain.

In one approach, the nozzle 1802 (e.g. nozzle, sub-nozzles, etc.) may be controllable such that the direction of the airflow may be modified. For example, the angle and/or shape of the downward-directed narrow opening may be adjustable to create a wider and/or narrower air curtain. The nozzle may comprise one or more individually controllable baffles for directing the air curtain. In one approach, the nozzle comprises venting air diverters for adjusting the angle of the airflow in order to change the direction of the air curtain and/or to create a wider and/or narrower air curtain.

In one configuration, the fan 1804 may comprise one or more blade fans, centrifugal blowers, positive displacement blowers, squirrel cage blowers, other blowers, or any other type of apparatus known in the art for creating a current of air.

The data storage library may comprise one or more fans which draw air from a rear of the array of drive slots. The air from the rear of the array of drive slots typically comprises air drawn through the tape drive canisters which is warmed via the internal electronics, the movement of the fans, etc.

In one approach, the fans may be individually controllable such that one or more of the fans may be turned off and on, the speed may be adjusted, a second fan may start only when a trigger condition occurs as a boosting effect, one or more of the fans are capable of reversing directions, etc.

In one configuration, one or more fans may be individually controllable such that one or more fans may be turned off until the fan(s) are instructed to turn on. In another approach, the one or more fans may be individually controllable such that one or more of the fans may be turned on until one or more of the fans are instructed to turn off.

In yet another approach, a second fan may be turned off and, in response to a trigger condition, turned on to create a boosting effect. A boosting effect may increase the mixing of relatively cooler air with air in the airflow. A boosting effect may include turning on a second fan to increase the velocity of the airflow in the air curtain and/or throughout the housing.

In another approach, reversing the direction of the one or more fans may reverse the direction of the airflow. The fans may reverse the direction of the airflow in order to adjust the intermixing between the outside air and the air in the air curtain that is drawn into the tape drive canisters. The direction of the fan may be reversed in response to a trigger condition.

As mentioned above, various actions (e.g. such as starting one or more fans) may occur upon detecting a trigger condition. A trigger condition may include detecting opening of a front door of the data storage library, receiving a command to run the fan from a user, occurrence of a specific time based on a predetermined schedule, sensing the temperature is too high based on a predefined operating temperature threshold, sensing the temperature is too low based on a predefined operating temperature threshold, sensing the humidity is too high based on a predefined operating humidity threshold, and sensing the humidity is too low based on a predefined operating humidity thresholds, etc. The predefined operating temperature threshold may be a temperature of the outside air at or above which condensation could occur if the outside air is drawn into the tape drives. The predefined operating temperature threshold may be above optimal temperatures for tape drive operation. The predefined operating humidity threshold may be a humidity level of the outside air at or above which condensation could occur if the outside air is drawn into the tape drives. The predefined operating humidity threshold may be above optimal humidity levels for tape drive operation.

In one approach, the velocity of the air in the airflow created by the fan is sufficient to create a barrier to outside air. The fan and nozzle for directing the airflow create a velocity of airflow in the air curtain such that the intermixing is less than 10% intermixing of outside air with the air drawn into the tape drives behind the air curtain. The intermixing may be less than approximately 10%, 9%, 8%, 7%, 6%, 5%, 4%, 3%, 2%, or 1% intermixing of outside air with the air drawn into the tape drives. In another approach, the intermixing may be 0%.

The data storage library may include at least one cold air inlet for mixing relatively cooler air with air being moved by the fan. The cold air inlets may receive relatively cooler air for mixing with air in the airflow from one or more sources of relatively cooler air. Cold air may be used interchangeably herein to refer to "relatively cooler air."

In one configuration, the cold air inlet receives relatively cooler air for mixing with air in the airflow from one or more air conditioning units which are positioned above the fan and/or the nozzle. The air conditioning unit may be of any type known in the art. The air conditioning unit may be a CRAC unit, a central air conditioning unit, a ductless mini-split air conditioning unit, a hybrid air conditioner, a HVAC system, etc.

In one configuration, the data storage library may comprise data storage drives in at least some of the drive slots, where the data storage library is configured to create a full air curtain across the entire front of the occupied drive slots. The volume of air entering the full air curtain may be at least as great as the volume of air the drives in the drive slots cumulatively draw. The volume of air entering the full air curtain may be measured per unit time and the volume of air the drives in the drive slots cumulatively draw may be measured per the same unit of time.

The data storage library may comprise a robotic accessor configured to move data storage cartridges between storage slots and drives in the drive slots, where the air curtain position is between a travel path of the robotic accessor and the front array of the drive slots. The robotic accessor may be of the type as described above in FIGS. 1-8. In one approach, the air curtain is thin enough to be effective even if an accessor is located in front of the drives being protected by the air curtain.

In another approach, the data storage library comprises a door and a switch for detecting when the door is open, where the data storage library is configured to activate the fan in response to detecting that the door is open. Such a door and a switch for detecting when the door is open may be any of a type known in the art.

In yet another approach, the data storage library comprises a temperature sensor for detecting a temperature in the data storage library. The data storage library may be configured to activate the fan in response to detecting a temperature in a predefined range. The temperature sensor may be a negative temperature coefficient (NTC) thermistor, a resistance temperature detector (RTD), a thermocouple, a semiconductor-based sensor, an infrared sensor, a bimetallic device, a thermometer, a change-of-state sensor, etc. The temperature sensor may be any temperature sensor known in the art.

In another approach, the data storage library comprises a humidity sensor for detecting a humidity level in the data storage library. The data storage library may be configured to activate the fan in response to detecting a humidity level in a predefined range. The humidity sensor may be a capacitive sensor, a resistive sensor, a thermally conductive sensor, etc. The humidity sensor may be any humidity sensor known in the art.

Figure 19:
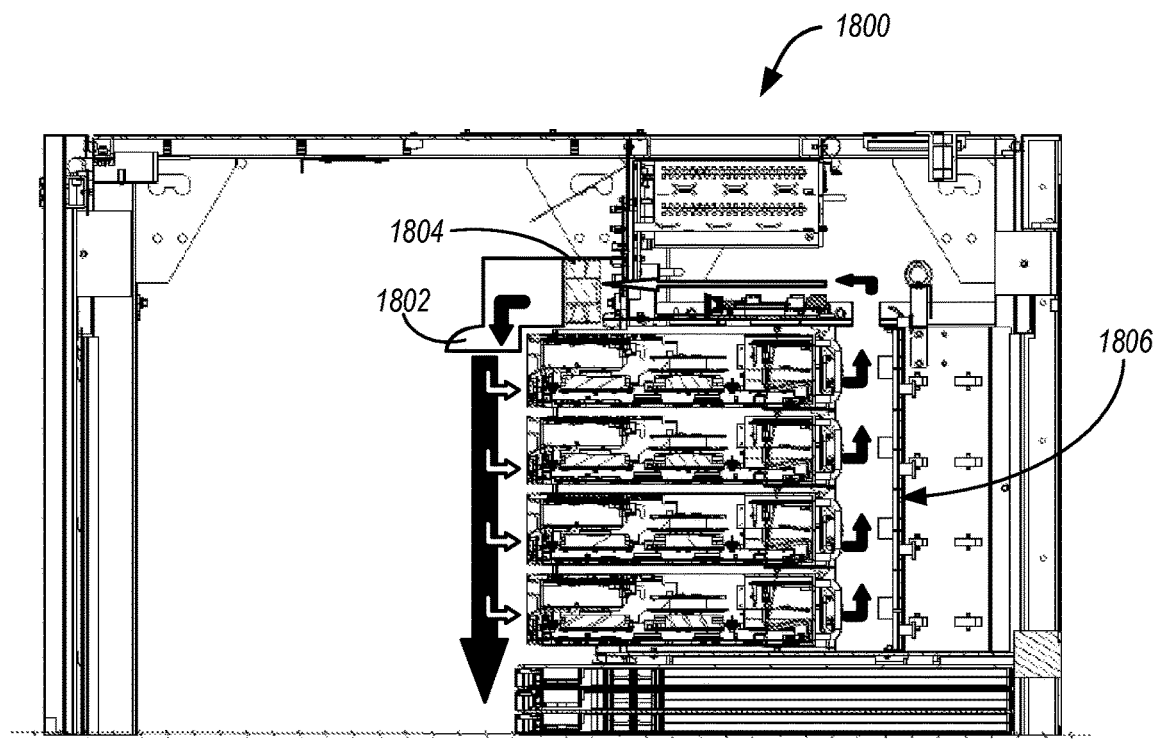
FIG. 19 is a partial cross-sectional side view of a storage frame of the data storage library of FIG. 10 according to one approach.

FIG. 19 illustrates a partial cross-sectional side view of a storage frame 1800 of the data storage library 1000 of FIG. 10 according to one approach. As an option, the storage frame 1800 may be implemented in conjunction with features from any other approach listed herein, such as those described with reference to the other FIGS. Of course, however, such a storage frame 1800 and others presented herein may be used in various applications and/or in permutations which may or may not be specifically described in the illustrative configurations listed herein. Further, the storage frame 1800 presented herein may be used in any desired environment.

FIG. 19 illustrates a configuration of a data storage library which comprises an array of drive slots each configured to receive a data storage drive therein, a nozzle 1802 for creating an air curtain across a front of the array of drive slots, and a fan 1804 for creating an airflow through the nozzle. Paneling, ducting, and/or any other known type of barrier may be present at the rear of the drives to direct the circulating air back to the air curtain. In the example shown, a panel 1806 isolates the air exiting the drives from the remaining areas of the storage frame and directs it to the air curtain.

FIG. 19 illustrates an exemplary airflow in a data storage library created by an air curtain. The air curtain generator may operate in a recirculation mode and/or a continuous mode according to various approaches. In a continuous mode, the fans in the data storage library continuously until the fan is instructed otherwise.

In a recirculation mode, one or more fans are turned on in response to a trigger condition. A trigger condition may include detecting opening of a front door of the data storage library, receiving a command to run the fans from a user, occurrence of a specific time based on a predetermined schedule, sensing the temperature is too high based on a predefined operating temperature threshold, sensing the temperature is too low based on a predefined operating temperature threshold, sensing the humidity is too high based on a predefined operating humidity threshold, and sensing the humidity is too low based on a predefined operating humidity thresholds, etc. The predefined operating temperature threshold may be a temperature of the outside air at or above which condensation could occur if the outside air is drawn into the tape drives. The predefined operating temperature threshold may be above optimal temperatures for tape drive operation. The predefined operating humidity threshold may be a humidity level of the outside air at or above which condensation could occur if the outside air is drawn into the tape drives. The predefined operating humidity threshold may be above optimal humidity levels for tape drive operation.

In the recirculation mode, the tape drive canisters do not draw air from the accessor aisle and/or air from outside the library coming through the open library door. The tape drive canister cooling fans draw air supplied from the air curtain. The tape drive canisters exhaust air toward the back of the frame. The airflow in the air curtain may tend to form a recirculating loop through the tape drive canisters and back through the fan and the nozzle. The recirculating air tends to increase in temperature over time due to heat generated in the drive electronics in addition to the fan motion. The recirculating air is preferably selectively mixed with relatively cooler air in order to create air that is the proper temperature and/or humidity level to be exhausted as the air curtain. Because of the shape of the airflow in the air curtain, the airflow in the air curtain infrequently mixes with the warmer air generated by the drive electronics. If a library door is in an open configuration, the warm, moist outside air is not substantially drawn into the tape drive canister even though the tape drive canister cooling fans continue to operate normally.

The front door of the library may be fully opened immediately after the one or more fans are turned on and the air curtain flows when the fans are in the recirculation mode. The air curtain allows for faster access to the library because there is no need to wait for the internal temperature of the tape drive canisters to increase sufficiently before opening the library door.

Additionally, the tape drive canisters do not periodically draw in potentially hazardous outside air which otherwise occurs in the absence of the air curtain when the cooling fans in the data storage library turn on to protect the drive internal electronics from overheating.

The tape drive internal electronics do not suffer from repeated thermal cycling in a recirculation mode, as they do in a conventional self-protect mode without an air curtain. Thermal cycling occurs when the tape drive internal electronics are operating to near-overheating conditions every few minutes whenever the tape drive canister cooling fans are turned from on to off and vice versa in a self-protect mode. Thermal cycling causes internal stress, e.g. corrosion, on the solder joints and/or other mechanical elements of the electronics. High operating temperatures reduce the life of the tape drive internal electronics. The recirculation mode prevents the occurrence of thermal cycling and improves the life and reliability of the tape drive internal electronics.

Figure 20:
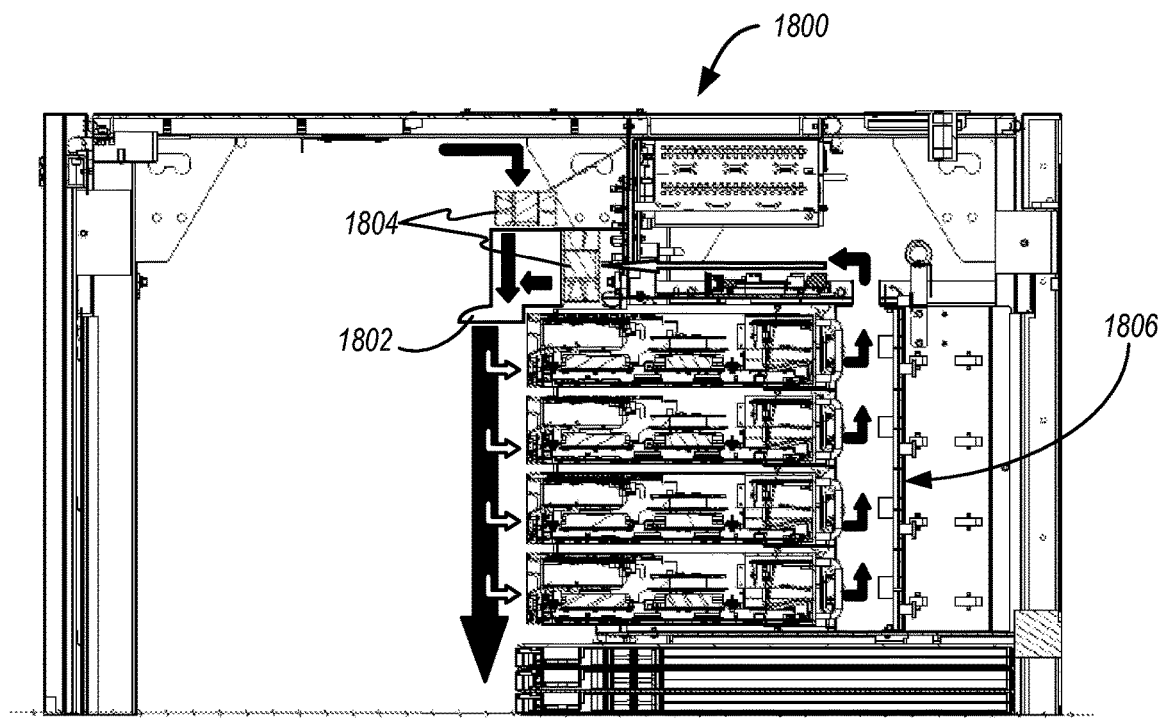
FIG. 20 is a partial cross-sectional side view of a storage frame of the data storage library of FIG. 10 according to one approach.

FIG. 20 illustrates a partial cross-sectional side view of a storage frame 1800 of the data storage library 1000 of FIG. 10 according to one approach. As an option, the storage frame 1800 may be implemented in conjunction with features from any other approach listed herein, such as those described with reference to the other FIGS. Of course, however, such a storage frame 1800 and others presented herein may be used in various applications and/or in permutations which may or may not be specifically described in the illustrative configurations listed herein. Further, the storage frame 1800 presented herein may be used in any desired environment.

FIG. 20 illustrates a configuration of a data storage library which comprises an array of drive slots each configured to receive a data storage drive therein, a nozzle 1802 for creating an air curtain across a front of the array of drive slots, and a fan 1804 for creating an airflow through the nozzle.

FIG. 20 illustrates an exemplary airflow in a data storage library created by fans 1804 in the data storage library coupled to a source (not shown) of cooler air providing cooler air from the top panel. Paneling, ducting, and/or any other type of barrier may be present at the rear of the drives to direct the circulating air back to the air curtain. In the example shown, a panel 1806 isolates the air exiting the drives from the remaining areas of the storage frame and directs it to the air curtain. Moreover, paneling, ducting, and/or any other known type of barrier may be present to direct the cooler air to the air curtain. In the example shown, the cooler air enters through the top panel of the storage frame, as indicated by the bend arrow originating near the top panel of the storage frame.

The fans may operate in a recirculation mode and/or a continuous mode, according to various approaches. In a recirculation mode, the fans are turned on in response to a trigger condition, e.g., as described above with reference to FIG. 19.

In a continuous mode, one or more fans operate continuously until instructed otherwise. For example, in a continuous mode, the fan(s) remain turned on indefinitely, and in the approach shown in FIG. 20, the inlet(s) are controlled so that a relatively warm air stream and a relatively cooler air stream are selectively mixed such that the air curtain airflow is a substantially constant and desired temperature and/or relative humidity.

In the continuous mode, one or more fans selectively control the mixing of relatively cooler air with air being moved by the fan(s) for cooling the air. The relatively cooler air is selectively added to air being moved by the fan for cooling based on at least one factor. Factors to be considered for determining whether to selectively add relatively cooler air include temperature sensor readings and/or humidity sensor readings. The temperature and/or the relative humidity of the air may be optimized so that data may be written and read to the tape media at substantially stable and optimal conditions.

In a preferred approach of the continuous mode, each fan in the data storage library may draw air from different plenums in the frame (e.g. one plenum being a relatively warmer air source and another plenum being a relatively cooler air source). The sensors in the data storage library sense the temperature and/or relative humidity states of the inlet air and/or the mixed air. The data storage library adjusts the settings of the fan(s) according to the temperature and/or humidity states in order to control the temperature and/or relative humidity of the exhausted air of the air curtain.

In one approach, a method for controlling air curtain generation, e.g., in the continuous mode and/or recirculation mode, is provided. The method may be performed in accordance with the present invention in any of the environments disclosed herein. Of course, more or less operations that those specifically described in herein may be included in the method, as would be understood by one of skill in the art upon reading the present description.

Each of the steps of the method may be performed by any suitable component of the operating environment. For example, in various aspects, the method may be partially or entirely performed by a computer, or some other device having one or more processors therein. The processor, e.g., processing circuit(s), chip(s), and/or module(s) implemented in hardware and/or software, and preferably having at least one hardware component may be utilized in any device to perform one or more steps of the method. Illustrative processors include, but are not limited to, a central processing unit (CPU), an application specific integrated circuit (ASIC), a field programmable gate array (FPGA), etc., combinations thereof, or any other suitable computing device known in the art.

The method may initiate with selectively instructing a fan to create an airflow through a nozzle for creating an air curtain across a front of an array of drive slots in a data storage library.

The data storage library may comprise one or more fans for creating an airflow. In one approach, the fan may comprise one or more blade fans, centrifugal blowers, positive displacement blowers, squirrel cage blowers, other blowers, or any other type of apparatus for creating a current of air known in the art.

In one approach, the fans may be individually controllable such that one or more of the fans may be turned off and on, the speed of the fans may be adjusted, a second fan may start only when a trigger condition occurs as a boosting effect, one or more of the fans are capable of reversing directions, etc.

In one approach, the fan draws air from a rear of the array of drive slots. Air from the rear of the array of drive slots typically comprises air that has passed through the tape drive canisters which is warmed via the internal electronics, the movement of the fans, etc. One or more fans in the data storage library are used for drawing air from a rear of the array for cooling the air.

Another operation of the method comprises mixing relatively cooler air with air being moved by the fan for cooling the air. One or more fans may be used to selectively mix the relatively cooler air with air being moved through the air curtain. Again, the one or more fans may be individually controllable. Mixing relatively cooler air with air being moved by the fan may include turning on a first fan, turning on a second fan, increasing the speed for one or more of the fans, instructing a cold air supply system to send relatively cooler air to the data storage library, etc.

In one configuration, the air curtain position is between a travel path of a robotic accessor and the front of the array of drive slots. The data storage library may comprise a robotic accessor configured to move data storage cartridge between storage slots and drives in the drive slots. The robotic accessor may be of the type as described above in FIGS. 1-8. In one approach, the air curtain is thin enough to be effective even if an accessor is located in front of the drives being protected by the air curtain.

In one approach, the air curtain across a front of an array of drive slots in the data storage library may comprise a volume of air entering the full air curtain which is at least as great as the volume of air the drives in the drive slots cumulatively draw. The volume of air entering the full air curtain may be measured per unit time and the volume of air the drives in the drive slots cumulatively draw may be measured per the same unit of time.

In one operation of the method, the fan is instructed to run continuously when a continuous mode is active, where the fan is only instructed to run in response to a trigger condition when a recirculating mode is active.

A trigger condition may include detecting opening of a front door of the data storage library, receiving a command to run the fan from a user, occurrence of a specific time based on a predetermined schedule, sensing the temperature is too high based on a predefined operating temperature threshold, sensing the temperature is too low based on a predefined operating temperature threshold, sensing the humidity is too high based on a predefined operating humidity threshold, and sensing the humidity is too low based on a predefined operating humidity thresholds, etc., e.g., as described above.

In one approach of the method, the fan is instructed to run continuously in a continuous mode, where relatively cooler air is selectively added to air being moved by the fan for cooling the air based on at least one factor. Factors to be considered for determining whether to selectively add relatively cooler air include temperature sensor readings and/or humidity sensor readings.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

A data processing system suitable for storing and/or executing program code may include at least one processor, which may be or be part of a controller, coupled directly or indirectly to memory elements through a system bus, such as processor 400 of FIG. 4. The memory elements can include local memory employed during actual execution of the program code, such as nonvolatile memory 404 of FIG. 4, bulk storage, and cache memories which provide temporary storage of at least some program code in order to reduce the number of times code must be retrieved from bulk storage during execution.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. An air curtain canister for creating an air curtain, the air curtain canister comprising:
a housing having a form factor approximating an exterior of a data storage drive, the housing having a longitudinal axis extending between ends thereof that are located farthest apart;
a fan for creating an airflow in the housing; and
a nozzle for directing the airflow exiting the housing in a predefined trajectory for creating an air curtain, the predefined trajectory being approximately orthogonal to the longitudinal axis of the housing.

2. An air curtain canister as recited in claim 1, comprising a cold air inlet for receiving relatively cooler air for mixing with air in the airflow.

3. An air curtain canister as recited in claim 2, comprising a valve for selectively controlling an amount of the cold air mixed with the air in the airflow.

4. An air curtain canister as recited in claim 2, comprising a second fan for selectively controlling an amount of the cold air mixed with the air in the airflow.

5. An air curtain canister as recited in claim 1, comprising a heater for heating air in the airflow.

6. An air curtain canister as recited in claim 1, wherein a velocity of air in the air curtain is sufficient to create a barrier to outside air.

7. An air curtain canister as recited in claim 1, wherein the air curtain canister has guide features for mounting in a drive slot of a data storage library.

8. An air curtain canister as recited in claim 1, comprising a second fan for also creating the airflow.

9. An air curtain canister as recited in claim 8, wherein the fan and the second fan are individually controllable.

10. A data storage library, comprising:
an array of drive slots each configured to receive a data storage drive therein; and
a plurality of air curtain canisters positioned laterally in the array of drive slots for creating an air curtain across a front of the remaining drive slots in the array.

11. A data storage library as recited in claim 10, wherein each air curtain canister comprises:
a housing having a form factor approximating an exterior of a data storage drive,
a fan for creating an airflow in the housing; and
a nozzle for directing the airflow exiting the housing in a predefined trajectory for creating the air curtain.

12. A data storage library as recited in claim 11, wherein the fan draws air from a rear of the array of drive slots.

13. A data storage library as recited in claim 12, wherein at least some of the air curtain canisters comprise a cold air inlet for mixing cooler air with air being moved by the fan.

14. A data storage library as recited in claim 11, comprising a robotic accessor configured to move data storage cartridges between storage slots and drives in the drive slots, wherein the air curtain position is between a travel path of the robotic accessor and the front of the array of drive slots.

15. A data storage library as recited in claim 11, comprising data storage drives in at least some of the drive slots, wherein the air curtain canisters are positioned to create a full air curtain across the entire front of the occupied drive slots, wherein a volume of air entering the full air curtain is at least as great as a volume of air the drives in the drive slots cumulatively draw.

16. A method, comprising:
selectively instructing air curtain canisters in a data storage library to create an air curtain across a front of an array of drive slots in the data storage library.

17. A method as recited in claim 16, wherein the air curtain canisters draw air from a rear of the array of drive slots.

18. A method as recited in claim 16, comprising mixing cooler air with air being moved through the air curtain canisters for cooling the air.

19. A method as recited in claim 16, comprising heating air being moved by the air curtain canisters.

20. A method as recited in claim 16, wherein the air curtain position is between a travel path of a robotic accessor and the front of the array of drive slots.

21. A method as recited in claim 16, wherein a volume of air per unit time entering into the air curtain is at least as great as a volume of air per unit time the drives in the drive slots cumulatively draw.

22. A method as recited in claim 16, wherein the air curtain canisters are instructed to run continuously when a continuous mode is active, wherein the air curtain canisters are only instructed to run in response to a trigger condition when a recirculating mode is active.

23. A method as recited in claim 16, wherein the air curtain canisters are instructed to run in response to a trigger condition, wherein the trigger condition is selected from the group consisting of: detecting opening of a front door of the data storage library, receiving a command to run the air curtain canisters from a user, occurrence of a specific time based on a predetermined schedule, sensing a temperature is too high based on a predefined operating temperature threshold, sensing the temperature is too low based on a predefined operating temperature threshold, sensing a humidity is too high based on a predefined operating humidity threshold, and sensing the humidity is too low based on a predefined operating humidity thresholds.

24. A method as recited in claim 16, wherein the air curtain canisters are instructed to run continuously in a continuous mode, wherein cooler air is selectively added to air being moved by at least some of the air curtain canisters for cooling the air based on at least one factor selected from the group consisting of: a temperature reading of the air and a humidity reading of the air.

* * * * *